United States Patent [19]
Fukumoto et al.

[11] Patent Number: 5,673,222
[45] Date of Patent: Sep. 30, 1997

[54] NONVOLATILE SEMICONDUCTOR MEMORY DEVICE

[75] Inventors: Katsumi Fukumoto, Nara; Masamitsu Taki, Tenri, both of Japan

[73] Assignee: Sharp Kabushiki Kaisha, Osaka, Japan

[21] Appl. No.: 666,979

[22] Filed: Jun. 20, 1996

[30] Foreign Application Priority Data

Jun. 20, 1995 [JP] Japan ........................ 7-153687
Sep. 29, 1995 [JP] Japan ........................ 7-254041

[51] Int. Cl.$^6$ .................................................. G11C 11/34
[52] U.S. Cl. ...................... 365/185.04; 365/185.11; 365/195
[58] Field of Search .................... 365/185.04, 185.11, 365/195, 230.08

[56] References Cited

U.S. PATENT DOCUMENTS

| | | |
|---|---|---|
| 5,053,990 | 10/1991 | Kreifels et al. . |
| 5,245,570 | 9/1993 | Fazio et al. . |
| 5,249,158 | 9/1993 | Kynett et al. . |
| 5,363,334 | 11/1994 | Alexander et al. ........... 365/185.04 |
| 5,381,369 | 1/1995 | Kikuchi et al. ............. 365/185.04 |
| 5,506,806 | 4/1996 | Fukushima .................. 365/195 |

FOREIGN PATENT DOCUMENTS 5-109293  4/1993  Japan .

*Primary Examiner*—David C. Nelms
*Assistant Examiner*—Huan Hoang
*Attorney, Agent, or Firm*—Morrison & Foerster LLP

[57] ABSTRACT

An electrically erasable and rewritable semiconductor memory device including at least one memory block, comprising: a WP signal generator for generating a WP signal for controlling protection of data stored in the memory block; a protect state setting section for setting a protect state for the memory block, the data stored in the memory block being protectable from erase/write operations when the protect state is set to the memory block; and a data protecting section for prohibiting the erase/write operations for the memory block to which the protect state is set, in the case where the WP signal is active. The WP signal generator includes: a WP set command identifying section for receiving a WP set command represented by at least one predetermined value selected from values of data and values of at least one address which are input in at least one bus cycle, and for identifying the WP set command by detecting the at least one predetermined value; and a generating section for activating the WP signal when the WP set command is identified during the WP signal is inactive.

32 Claims, 17 Drawing Sheets

FIG. 3

| Command | 1st write cycle | | 2nd write cycle | |
|---|---|---|---|---|
| | Address | Data | Address | Data |
| Data write | Don't care | 40H | WA | WD |
| Block erase | Don't care | 20H | BA | D0H |
| Lock block | Don't care | 77H | BA | D0H |

FIG. 4

| WP signal | Protect state setting | Erase/write operation |
|---|---|---|
| H | Protected | Prohibited |
| | Erase/write | Allowed |
| L | Protected | Allowed |
| | Erase/write | Allowed |

FIG.13

| Command | 1st write cycle | | 2nd write cycle | |
|---|---|---|---|---|
| | Address | Data | Address | Data |
| WP release | Don't care | 47H | FFH | D0H |

FIG.14

| WP release command examples | 1st write cycle | | 2nd write cycle | |
|---|---|---|---|---|
| | Address | Data | Address | Data |
| WPR-1 | Don't care | 47H | Don't care | D0H |
| WPR-2 | FFH | 47H | Don't care | D0H |
| WPR-3 | FFH | 47H | FFH | D0H |

FIG. 16

| Command | 1st write cycle | | 2nd write cycle | |
|---|---|---|---|---|
| | Address | Data | Address | Data |
| WP set | Don't care | 57H | FFH | D0H |

FIG.18

| WP set command examples | 1st write cycle | | 2nd write cycle | |
|---|---|---|---|---|
| | Address | Data | Address | Data |
| WPS-1 | Don't care | 57H | Don't care | D0H |
| WPS-2 | FFH | 57H | Don't care | D0H |
| WPS-3 | FFH | 57H | FFH | D0H |

NONVOLATILE SEMICONDUCTOR MEMORY DEVICE

BACKGROUND OF THE INVENTION

1. Field of the Invention

The present invention relates to nonvolatile semiconductor memory devices. More particularly, the present invention relates to electrically programmable and electrically erasable read-only memory devices.

2. Description of the Related Art

Erasable programmable read only memories (EPROMs) frequently utilize memory cells including transistors having electrically isolated gates, i.e., floating gates. These floating gates are typically completely surrounded by insulation, each of which is generally disposed between corresponding source and drain regions formed in a silicon substrate. Information is stored in the memory cells or devices in the form of charges on the floating gates. Avalanche injection is employed to inject charge through the insulation in order to charge the floating gate. Data of the EPROM cells are generally erased all at a time by exposing a full array of the memory cells to ultraviolet radiation.

A special programming device referred to as a programmer or writer is used for programming the EPROMs. EPROMs are often removed from their printed circuit boards for both erasing and programming. Thus, programming devices and the circuits boards for EPROMs require a removable structure, such as sockets for the EEPROM chip legs. This increases the overall cost of systems employing the EPROMs. In addition, ceramic packages having silica glass windows are used for EPROMs in order to be irradiated with ultraviolet radiation. This also makes the EPROM chips relatively expensive, even though EPROMs have a relatively low cost per bit as a result of their reduced memory cell area which utilizes one transistor per cell structure.

Electrically erasable programmable read only memories (EEPROMs) are also commonly used, which can be programmed and erased by a user. In some cases, charge is place into and removed from a floating gate by tunneling the charge through a thin oxide region (tunnel region) formed on the substrate. In other cases, charge is removed through an upper electrode (control gate).

These EEPROMs are typically programmed and erased while still installed in the same circuit (e.g., printed circuit board) which is used for reading data from the memory. That is, a special programming device such as a writer is not required. However, the EEPROM cells do not lend themselves to being reduced in substrate area as do the EPROM cells. Since a select transistor is provided to each EEPROM cell, a typical cell area of the EEPROMs is one and a half to twice as large as that of the EPROMs. This increases a cost per bit of EEPROMs, which is not conducive to high integration.

More recently, a new category of electrically erasable EPROMs/EEPROMs has emerged. These memory devices are sometimes referred to as "flash" EPROMs/EEPROMs, or flash memories. The flash memories can be programmed by a user, typically, byte by byte. Once programmed, the flash memory retains its data until erased. The entire contents of the flash memory can be electrically erased in one relatively rapid operation. A high erasing voltage is made available to sources of all the cells in the flash memory simultaneously, resulting in a full array erasure.

In some cases, a flash memory is divided into a plurality of memory regions which is referred to as blocks or sectors, so that the data can be erased by regions, i.e., block by block. This makes it possible to prevent unnecessary erasure of the data. Such memory devices are described in, for example, U.S. Pat. No. 5,249,158 and U.S. Pat. No. 5,245,570.

In flash memories, select transistors are not required for each memory cell. For example, no select transistors are required for a flash memory in which the entire array is erased, and only one select transistor per memory block is required for a flash memory which includes memory blocks. Thus, memory cell configuration of the flash memories are almost the same as that of EPROMs, realizing one transistor per one memory cell. As a result, flash memories are advantageous for high integration. In addition, since the data is electrically written to and erased from the EEPROMs, relatively inexpensive plastic packages are used and no removable structure is required for such flash EEPROMs.

FIG. 1A schematically shows a cell transistor 40 of each memory cell in such flash memories, and FIG. 1B shows an exemplary structure of the cell transistor 40 in the memory cell. As shown in FIGS. 1A and 1B, the cell transistor 40 is a metal oxide semiconductor field effect transistor (MOSFET) of a floating gate type. A floating gate 42 is provided under a control gate 41 with a gate insulating oxide film 45 sandwiched therebetween.

Programming a flash memory, i.e., writing data to flash memory cells is performed as follows: The control gate 41 of the cell transistor 40 is applied with a high voltage of about 12 V, a drain 44 thereof is applied with a voltage of about 7 V, and a source 43 thereof is grounded at 0 V, for example. As a result, hot electrons generated in the vicinity of a junction of the drain 44 are injected into the floating gate 42 through a gate insulating layer 46. The cell transistor 40 in which the floating gate 42 is injected with electrons, i.e., electrically charged, the threshold voltage from the control gate 41 becomes higher. Thus, the data, e.g., "1" is written to the memory cell.

It is required to supply each cell transistor 40 with a relatively large amount of electric current of about 1 mA in order to write the data using hot electrons. Thus, in some flash memories, in order to reduce the amount of electric current required for writing data, Fowler-Nordheim (FN) tunnel currents are used for injecting electrons to write the data to the memory cells in the same manner as that of typical EEPROMs.

Erasure operation of the data is performed typically as follows: The control gate 41 of the cell transistor 40 is grounded and the source 43 is applied with a high erasure voltage $V_{pp}$ of about 12 V to generate a relatively intense electric field between the floating gate 42 and the source 43. As a result, electrons stored in the floating gate 42 are extracted to the source 43 by a tunnel effect through the gate insulating film 46 which is relatively thin. The threshold voltage from the control gate 41 becomes low by the extraction of the electrons. Thus, the data "1" is erased from the memory cell.

In the erasure operations, in the case where an "over-erasing" or an over-extracting of the electrons from the floating gate 42 occurs, the threshold voltage of the cell transistor 40 has a negative value. The negative threshold voltage of the cell transistor 40 in one memory cell allows a leakage current on a bit line to which the memory cell couples. Such a leakage current interferes access operations to other memory cells coupled to the same bit line, resulting in critical default of the memory device. Thus, such over-extraction during the erasure operations should be prevented.

In the above mentioned erasure operation, a relatively high voltage is applied to the source 43 of the cell transistor 40 so that a relatively high voltage resistance of a junction of the source 43 is required. Accordingly, configuration of the source 43 (e.g., source electrode) is not rendered to be miniaturized. In addition, some of hot holes which are generated in the vicinity of the source 43 are trapped in the gate insulating layer 46, degrading reliability of the cell transistor 40 of the memory cell. Furthermore, tunnel currents on the order of milliamps (mAs) flow between bands in an entire chip during the erasure operation. A typical step-up circuit is not sufficient for supplying such large currents, consequently, an external source supply for supplying the high erasure voltage $V_{pp}$ is required.

In order to avoid the problems of the above erasure method using a high erasure voltage, another erasure method using a negative voltage has been proposed. This method is referred to as a "negative gate erasure". In the negative gate erasure, the control gate 41 of the cell transistor 40 is applied with a negative voltage of about −10 V, and the source 43 is applied with a source supply voltage $V_{cc}$ of about 3 V or 5 V, so that the data is erased by tunnel currents flowing from the source 43 to the floating gate 42.

By utilizing the negative gate erasure, the source 43 is not applied with a high voltage, therefore the source 43 is not required to have a high voltage resistance. This makes it possible to miniaturize the source configuration. In addition, the source supply voltage $V_{cc}$ can be applied to the source 43 as an erasure voltage, eliminating an external high voltage supply.

Reading operation is performed for the memory cell as follows: The source 43 is grounded at 0 V, and a relatively low voltage of about 1 V is applied to the drain 44. By applying the source supply voltage $V_{cc}$ (typically, about 5 V) to the control gate 41 of the cell transistor 40, a channel current flows according to the electric charge stored in the floating gate 42. That is, in the case where the floating gate 42 stores substantially no charge, the threshold voltage of the gate of the cell transistor 40 is low so that a drain current flows between the source 43 and the drain 44. In the case where the floating gate 42 stores charge injected in a manner described above, the threshold voltage of the gate of the cell transistor 40 goes high so as to prevent the drain current from flowing between the source 43 and the drain 44. Thus, by detecting the drain current, the data stored in the memory cell can be read out. For example, the drain current corresponds to data "0", and substantially no drain current corresponds to data "1".

The reason why the drain 44 is applied with the low voltage of about 1 V is to prevent a parasitic write operation (referred to as "soft-write") which is caused by applying a relatively high voltage to the drain 44.

As described above, write operations are performed through the drain junction, and erasure operations are performed through the source junction. Accordingly, respective junction profiles of the source 43 and drain 44 should be optimized for the corresponding operation. For example, the drain junction utilizes an electric field concentration type profile in order to improve efficiency of the write operation, while the source junction utilizes an electric field relaxation type profile so that a relatively high voltage can be applied to it. Thus, the drain and source junctions are formed asymmetric.

Recently, as portable electronic devices using batteries have become commercially available, the supply voltage $V_{cc}$ of some semiconductor devices has been reduced from about 5 V to about 3.3 V, associated with improvements in miniaturization techniques of semiconductor device fabrication process. Some flash memories are also developed, which utilize the reduced supply voltage $V_{cc}$ of 3.3 V. In the read operation of such flash memories, the supply voltage of 3.3 V or a step-up voltage of 5 V is used as a read-out voltage which is applied to the control gate 41 of the cell transistor 40. The relatively high read-out voltage is obtained using a step-up circuit provided in a chip for control gate lines (i.e., word lines). By using the relatively high read-out voltage, the read operation can be performed faster and more reliably.

These flash memories have much more operation states compared with those of random access memories (RAMs) in which write/read operations can be performed quickly. For example, flash memories include operation states of write operation, read operation, erasure operation for block, erasure operation for entire array (chip), read operation for a state register, and the like. In the case where so many operation states are to be controlled by assigning them to respective combinations of existing control signals, such as a chip enable signal CE-bar, a write enable signal WE-bar, and the like, the number of the control signals of conventional EPROMs/EEPROMs is made short in order to program and erase the flash memories. Thus, additional control signals and corresponding IC pins are required for the flash memory chips, since a direct pin-to-pin compatibility of the flash memories for the existing EPROMs/EEPROMs is not achieved. This makes it difficult to use flash memories in place of existing EPROMs/EEPROMs.

In order to maintain pin-to-pin compatibility between flash memories and conventional EPROMs/EEPROMs, a command port architecture has been utilized. Such a command port architecture is described, for example, in U.S. Pat. No. 5,053,990. In such a flash memory, utilizing the command architecture includes a command state machine (CSM) for receiving and identifying commands and a write state machine (WSM) for performing a specific operation corresponding to the identified command. The commands typically include data and addresses for specifying the operation to be performed.

As described above, in some flash memories, a memory array (memory chip) is divided into a plurality of blocks for erasure. The erasure blocks may have an equal size (e.g., see U.S. Pat. No. 5,245,570), or unequal sizes (e.g., example, see U.S. Pat. No. 5,249,158). The erasure block configuration having unequal sizes is referred to as a boot block configuration.

Some of the flash memories including a plurality of erasure blocks are provided with a write protect (WP) function for prohibiting a erasure operation for a certain erasure block. The WP function typically includes WP information for each erasure block stored in a chip and a WP-bar pin provided for the chip. Such a flash memory utilizing WP function is described, for example, in Japanese Laid-Open Publication No. 5-109293. The WP information sets respective erasure blocks in a WP (erase/write prohibited) state or a non-WP (erase/write enable) state. The WP-bar pin receives a WP control signal (WP-bar). When the WP control signal goes low (L: active), the WP is enabled so that data of erasure blocks set in the WP state is prevented from erasure, while data of erasure blocks set in the non-WP state can be erased and re-written. When the WP control signal goes high (H: inactive), the WP state is canceled so that every erasure blocks in the chip can be erased and re-written regardless of their WP states.

Some flash memories having the boot block configuration adopt a WP mechanism in which WP and non-WP of respective erasure blocks are determined by applying or not applying a high voltage (12 V) to a certain IC pin.

However, flash memories having the WP function and an additional WP-bar pin cannot maintain pin-to-pin compatibility for conventional EPROMs/EEPROMs, so that the structure of peripheral circuits for the flash memories become complicated in order to allow the WP control signal to be input. In addition, before the WP control signal goes low so as to activate the WP function, important data stored in the chip can be erased or rewritten by mistake.

SUMMARY OF THE INVENTION

The non-volatile semiconductor memory device of this invention is electrically erasable and rewritable, and includes at least one memory block. The semiconductor memory device comprises: a WP signal generator for generating a WP signal for controlling protection of data stored in the memory block; a protect state setting section for setting a protect state for the memory block, the data stored in the memory block being protectable from erase/write operations when the protect state is set to the memory block; and a data protecting section for prohibiting the erase/write operations for the memory block to which the protect state is set, in the case where the WP signal is active. The WP signal generator includes: a WP set command identifying section for receiving a WP set command represented by at least one predetermined value selected from values of data and values of at least one address which are input in at least one bus cycle, and for identifying the WP set command by detecting the at least one predetermined value; and a generating section for activating the WP signal when the WP set command is identified during the WP signal is inactive.

In one embodiment of the present invention, the WP set command identifying section identifies the WP set command by detecting a predetermined combination including a specific value of data input in a first bus cycle and a specific value of data input in a second bus cycle.

In one embodiment of the present invention, the predetermined combination further includes at least one of a specific value of an address in the first bus cycle and a specific value of an address in the second bus cycle.

In one embodiment of the present invention, the WP set command identifying section includes: a data comparing circuit for detecting if input data matches a predetermined data value for each bus cycle, whereby outputting a data comparison result; a result latch circuit for latching the data comparison result; an address comparing circuit for detecting if an input address matches a predetermined address value for each bus cycle, whereby outputting an address comparison result; a logical circuit for identifying the WP set command when the data comparison result of a first bus cycle which is latched in the result latch circuit, the data comparison result of a second bus cycle, and the address comparison result of the second bus cycle are affirmative.

In one embodiment of the present invention, the WP set command identifying section further includes: a data latch circuit for latching data in each bus cycle; and an address latch circuit for latching an address in each bus cycle.

In one embodiment of the present invention, the generating section activates the WP signal when a system including the semiconductor memory device is turned on and when the system is reset.

In one embodiment of the present invention, the electrically erasable and rewritable semiconductor memory device includes a plurality of memory blocks and further includes a protect state set command identifying section for receiving a protect state set command and a protect address, the protect state set command being represented by at least one predetermined value selected from values of data and values of at least one address which are input in at least one bus cycle, the protect address representing a memory block to which the protect state is set and being input in the at least one bus cycle, and for identifying the protect state set command by detecting the at least one predetermined value. The protect state setting section sets the protect state for the memory block indicated by the protect address when the protect state set command is identified by the protect set command identifying section, and the generating section of the WP signal generator activates the WP signal when the protect state set command is identified by the protect state set command identifying section.

The semiconductor memory device of the present invention is electrically erasable and rewritable, and includes at least one memory block. The semiconductor memory device comprises: a WP signal generator for generating a WP signal for controlling protection of data stored in the memory block; a protect state setting section for setting a protect state for the memory block, the data stored in the memory block being protectable from erase/write operations when the protect state is set to the memory block; and a data protecting section for prohibiting the erase/write operations for the memory block to which the protect state is set, in the case where the WP signal is active. The WP signal generator includes: a WP release command identifying section for receiving a WP release command represented by at least one predetermined value selected from values of data and values of at least one address which are input in at least one bus cycle, and for identifying the WP release command by detecting the at least one predetermined value; and a generating section for inactivating the WP signal when the WP release command is identified during the WP signal is active.

In one embodiment of the present invention, the WP signal generator further includes a WP set command identifying section for receiving a WP set command represented by at least one predetermined value selected from values of data and values of at least one address which are input in at least one bus cycle, and for identifying the WP set command by detecting the predetermined combination, and the generating section activates the WP signal when the WP set command is identified during the WP signal is inactive.

In one embodiment of the present invention, the WP release command identifying section identifies the WP release command by detecting a predetermined combination including a specific value of data input in a first bus cycle and a specific value of data input in a second bus cycle.

In one embodiment of the present invention, the predetermined combination further includes at least one of a specific value of an address in the first bus cycle and a specific value of an address in the second bus cycle.

In one embodiment of the present invention, the WP release command identifying section includes: a data comparing circuit for detecting if input data matches a predetermined data value for each bus cycle, whereby outputting a data comparison result; a result latch circuit for latching the data comparison result; an address comparing circuit for detecting if an input address matches a predetermined address value for each bus cycle, whereby outputting an address comparison result; and a logical circuit for identifying the WP release command when the data comparison result of a first bus cycle which is latched in the result latch circuit, the data comparison result of a second bus cycle, and the address comparison result of the second bus cycle are affirmative.

In one embodiment of the present invention, the WP release command identifying section further includes: a data latch circuit for latching data in each bus cycle; and an address latch circuit for latching an address in each bus cycle.

In one embodiment of the present invention, the generating section activates the WP signal when a system including the semiconductor memory device is turned on and when the system is reset.

In one embodiment of the present invention, the electrically erasable and rewritable semiconductor memory device includes a plurality of memory blocks, and further comprises a protect state set command identifying section for receiving a protect state set command and a protect address, the protect state set command being represented by at least one predetermined value selected from values of data and values of at least one address which are input in at least one bus cycle, the protect address representing a memory block to which the protect state is set and being input in the at least one bus cycle, and for identifying the protect state set command by detecting the at least one predetermined value. The protect state setting section sets the protect state for the memory block indicated by the protect address when the protect state set command is identified by the protect state set command identifying section, and the generating section of the WP signal generator activates the WP signal when the protect state set command is identified by the protect state set command identifying section.

The method for protecting data stored in an electrically erasable and rewritable semiconductor memory device including at least one memory block, the method includes the steps of: generating a WP signal for controlling protection of the data stored in the memory block; setting a protect state for the memory block, the data stored in the memory block being protectable from erase/write operations when the protect state is set to the memory block; and prohibiting the erase/write operations for the memory block to which the protect state is set in the case where the WP signal is active. The method further includes the steps of: inputting a WP set command represented by at least one predetermined value selected from values of data and values of at least one address using least one bus cycle; identifying the WP set command by detecting the at least one predetermined value; and activating the WP signal when the WP set command is identified during the WP signal is inactive.

In one embodiment of the present invention, the WP set command identifying step includes detecting a predetermined combination including a specific value of data input in a first bus cycle and a specific value of data input in a second bus cycle.

In one embodiment of the present invention, the WP set command identifying step further includes detecting at least one of a specific value of an address in the first bus cycle and a specific value of an address in the second bus cycle.

In one embodiment of the present invention, the WP set command identifying step includes the step of: detecting if input data matches a predetermined data value for each bus cycle, whereby generating a data comparison result; latching the data comparison result; detecting if an input address matches a predetermined address value for each bus cycle, whereby generating an address comparison result; identifying the WP set command when the data comparison result of a first bus cycle which is latched in the latching step, the data comparison result of a second bus cycle, and the address comparison result of the second bus cycle are affirmative.

In one embodiment of the present invention, the WP set command identifying step includes the steps of: latching data in each bus cycle; and latching an address in each bus cycle.

In one embodiment of the present invention, the WP signal generating step includes a step for activating the WP signal when a system including the semiconductor memory device is turned on and when the system is reset.

In one embodiment of the present invention, the semiconductor memory device includes a plurality of memory blocks, and the method further comprises the steps of: inputting a protect state set command and a protect address, the protect state set command being represented by at least one predetermined value selected from values of data and values of at least one address which are input in at least one bus cycle, the protect address representing a memory block to which the protect state is set and being input in the at least one bus cycle; and identifying the protect state set command by detecting the at least one predetermined value; setting the protect state for the memory block indicated by the protect address when the protect state set command is identified; and activating the WP signal when the protect state set command is identified.

In one embodiment of the present invention, method includes the steps of: generating a WP signal for controlling protection of the data stored in the memory block; setting a protect state for the memory block, the data stored in the memory block being protectable from erase/write operations when the protect state is set to the memory block; and prohibiting the erase/write operations for the memory block to which the protect state is set in the case where the WP signal is active. The method further includes the steps of: inputting a WP release command represented by at least one predetermined value selected from values of data and values of at least one address using at least one bus cycle; identifying the WP release command by detecting the at least one predetermined value; and inactivating the WP signal when the WP release command is identified during the WP signal is active.

In one embodiment of the present invention, the method further includes the steps of: inputting a WP set command represented by at least one predetermined value selected from values of data and values of at least one address which are input in at least one bus cycle; identifying the WP set command by detecting the predetermined combination; and activating the WP signal when the WP set command is identified during the WP signal is inactive.

In one embodiment of the present invention, the WP release command identifying step includes the steps of detecting a predetermined combination including a specific value of data input in a first bus cycle and a specific value of data input in a second bus cycle.

In one embodiment of the present invention, the WP release command identifying step further includes detecting at least one of a specific value of an address in the first bus cycle and a specific value of an address in the second bus cycle.

In one embodiment of the present invention, the WP release command identifying step includes the steps of: detecting if input data matches a predetermined data value for each bus cycle, whereby generating a data comparison result; latching the data comparison result; detecting if an input address matches a predetermined address value for each bus cycle, whereby generating an address comparison result; and identifying the WP release command when the data comparison result of a first bus cycle which is latched in the latching step, the data comparison result of a second bus cycle, and the address comparison result of the second bus cycle are affirmative.

In one embodiment of the present invention, the WP release command identifying section further includes the steps of: latching data in each bus cycle; and latching an address in each bus cycle.

In one embodiment of the present invention, the WP signal generating section includes a step for activating the WP signal when a system including the semiconductor memory device is turned on and when the semiconductor memory device is reset.

In one embodiment of the present invention, the WP signal generating step includes a step for activating the WP signal when a system including the semiconductor memory device is turned on and when the system is reset.

In one embodiment of the present invention, the semiconductor memory device includes a plurality of memory blocks, and the method further comprises the steps of: inputting a protect state set command and a protect address, the protect state set command being represented by at least one predetermined value selected from values of data and values of at least one address which are input in at least one bus cycle, the protect address representing a memory block to which the protect state is set and being input in the at least one bus cycle; identifying the protect state set command by detecting the at least one predetermined value; setting the protect state for the memory block indicated by the protect address when the protect state set command is identified; and activating the WP signal when the protect state set command is identified.

Thus, the present invention described herein makes possible the advantages of (1) providing a non-volatile semiconductor memory device in which a write protect (WP) signal is internally generated so that an additional IC pin is not required, and (2) providing a non volatile semiconductor memory device in which the WP signal is controlled by a command which is externally input so as to activate/inactivate the protection of data.

These and other advantages of the present invention will become apparent to those skilled in the art upon reading and understanding the following detailed description with reference to the accompanying figures.

BRIEF DESCRIPTION OF THE DRAWINGS

FIG. 3 is a table showing command examples used in the nonvolatile semiconductor memory device according to the present invention.

FIG. 4 is a table showing the relationship between the WP signal state (active or inactive) and the corresponding protect state settings and erase/write operations.

FIG. 13 is a table showing an example of the WP release command.

FIG. 14 is a table showing other examples of the WP release command.

FIG. 16 is a table showing an example of the WP set command.

FIG. 18 is a table showing other examples of the WP set command.

DESCRIPTION OF THE PREFERRED EMBODIMENTS

Hereinafter, the present invention will be described by way of illustrative examples with reference to the accompanying drawings.

EXAMPLE 1

Figure 1A:
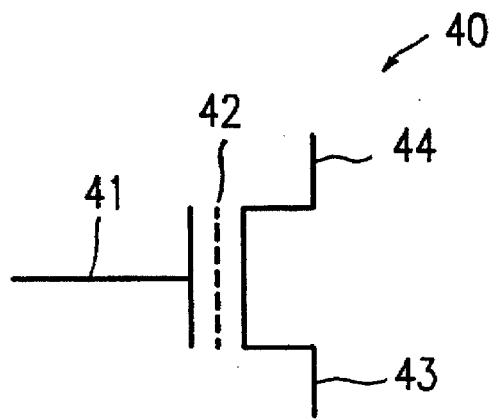
FIG. 1A is a schematic diagram illustrating a cell transistor of conventional flash memories.
Figure 1B:
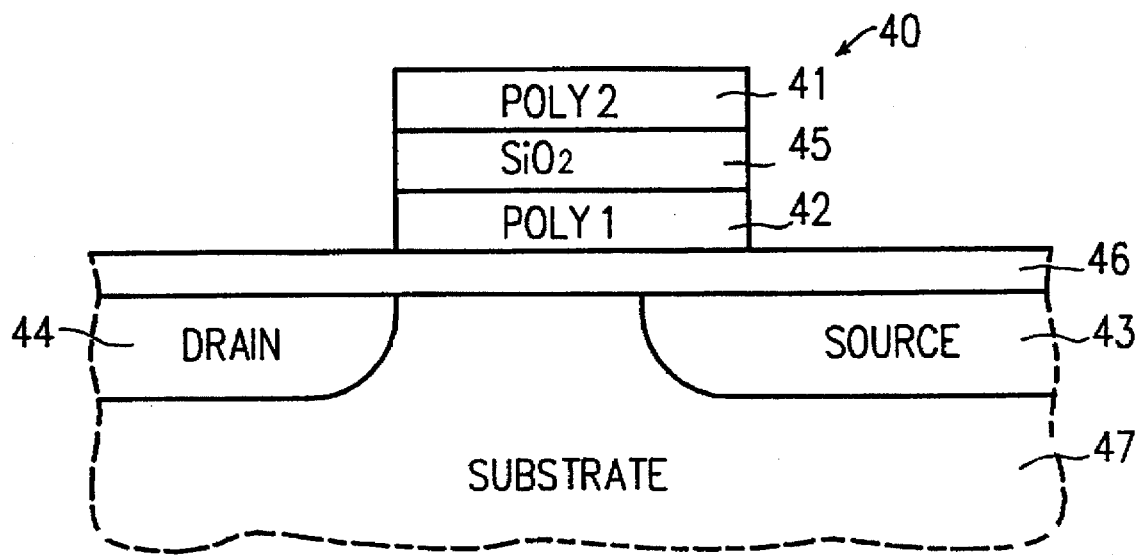
FIG. 1B is a schematic diagram illustrating a structure of conventional flash memories.
Figure 2:
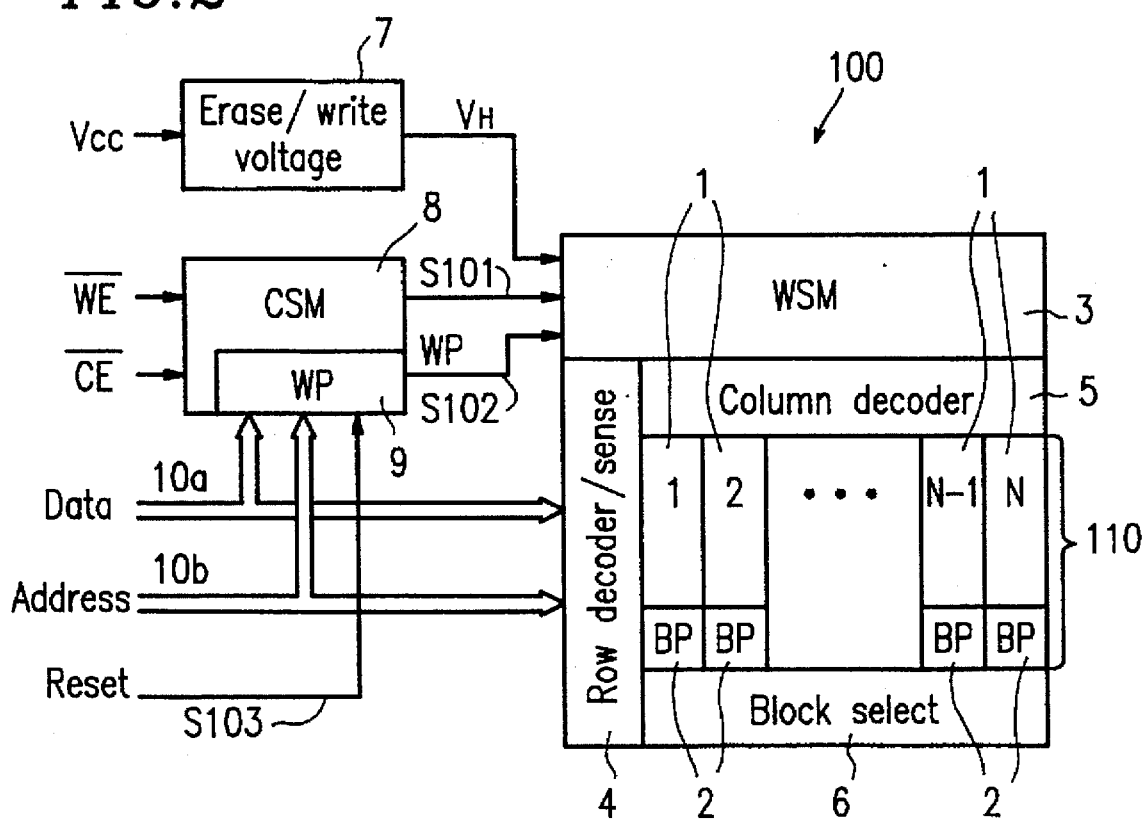
FIG. 2 is a schematic diagram illustrating a structure of the nonvolatile semiconductor memory according to the present invention.

A nonvolatile semiconductor memory device according to a preferred embodiment of the present invention is described. FIG. 2 shows a nonvolatile semiconductor memory device 100 which utilize flash memory cells such as described above with reference to FIGS. 1A and 1B. As shown in FIG. 2, the nonvolatile semiconductor memory device 100 includes a flash memory cell array 110, a row decoder/sensing circuit 4 including a row decoder section and a sensing section (not shown), a column decoder circuit 5, a block select circuit 6, a write state machine (WSM) 3, a command state machine (CSM) 8 including a write protect (WP) signal generator 9, and an erase/write voltage generator 7. Data is input to the row decoder/sensing circuit 4 and the WP signal generator 9 of the CSM 8 via a data bus 10a. Addresses are input to the row decoder/sensing circuit 4 (and the block select circuit 6) and the WP signal generator 9 of the CSM 8, via an address bus 10b.

The flash memory cell array 110 is divided into N erase blocks (sectors) 1, each including the same number of memory cells (not shown in FIG. 2). Each erase block 1 is provided with a respective block protect setting section 2 which utilizes nonvolatile memory cells. The WSM 3 performs write (i.e., programming) operations so as to write data to the memory cells in the erase blocks 1, and performs erase operations so as to erase the data from the memory cells by the unit of erase block 1.

In read/write operations, a memory cell is specified by selecting a word line (not shown) using the row decoder section of the row decoder/sensing circuit 4 and by selecting a bit line (not shown) using the column decoder circuit 5. The sensing section of the row decoder/sensing circuit 4 senses the bit line selected by the column decoder 5. In erase operations, the block select circuit 6 specifies the erase block 1 to be erased, based on an input address representing the erase block 1 to be erased. Accessing the flash memory cell array 110, i.e., addressing the respective memory cells and/or selecting the respective erase blocks 1, is performed in a manner which is well known in the conventional EPROMs/EEPROMs as described above, as will be appreciated.

The erase/write voltage generator 7 is a step-up circuit for generating a high voltage $V_H$ (for example, about 12 V) based on a supply voltage $V_{cc}$ which is provided externally. Erase/write operations for the flash memory cell array 110 are performed by applying the high voltage $V_H$ to the WSM 3. Alternatively, the present invention can utilize memory cells of a negative gate erasure type. In such a case, the erase/write voltage generator 7 generates a negative voltage instead of the high voltage $V_H$.

The CSM 8 identifies a respective command based on input control signals, i.e., a chip enable signal CE-bar and a write enable signal WE-bar, input data, and an input address. The chip enable signal CE-bar is a control signal for representing an access to the nonvolatile semiconductor memory device 100. Only when the chip enable signal CE-bar goes low (L: active), is the CSM 8 activated to operate. The write enable signal WE-bar is a control signal for distinguishing write operations and read operations. When the write enable signal WE-bar goes low (L: active), a bus cycle becomes a write cycle for performing write operations.

Input data is supplied to the row decoder/sensing circuit 4 as the data to be written to the memory cells, and also supplied to the CSM 8 to be used as commands. An input address is supplied to the row decoder/sensing circuit 4 and the column decoder 5 in order to specify a memory cell to which the data is written or from which the data is read, and to specify the erase block 1 from which the data is to be erased. The input address is also supplied to the CSM 8 to be used as commands.

When the chip enable signal CE-bar goes low, the CSM 8 is activated and detects whether the write enable signal WE-bar is active during a time period in which about one to three bus cycles are performed. The CSM 8 also identifies a command by detecting whether a value of the input data matches a predetermined value and, if necessary, whether the input address matches a predetermined address. The identified command is sent to the WSM 3 so as to perform a write operation or an erase operation according to the command. The CSM 8 is initialized by a reset signal S103 which is externally supplied to the CSM 8 when a whole system including the nonvolatile memory device 100 is turned on or the system is reset.

FIG. 3 shows some of the exemplary commands to be identified by the CSM 8. These exemplary commands are used in bus cycles for write operations, i.e., the chip enable signal CE-bar and the write enable signal WE-bar both go low (L: active). As shown in FIG. 3, a data write command is identified by detecting data having a value of 40H ("H" represents that the value is hexadecimal) in the first write cycle. Then, in the second write cycle, the CSM 8 performs a write operation based on a write address WA and write data WD by supplying a command signal S101 to the WSM 3, as shown in FIG. 2.

A block erase command is identified by detecting data having a value of 20H in the first write cycle and data having a value of D0H in the second write cycle. Thus, in the second write cycle, the CSM 8 performs an erase operation for a corresponding erase block 1 based on a block address BA for the block erasure by supplying the command signal S101 to the WSM 3.

A lock block command, which sets a corresponding erase block 1 in a write protect (WP) state, is identified by detecting data having a value of 77H in the first write cycle and data having a value of D0H in the second write cycle. Thus, in the second write cycle, the CSM 8 sets the WP state in the block protect setting section 2 of the corresponding erase block 1 based on a block address BA by supplying the command signal S101 to the WSM 3.

The above mentioned write operation, block erase operation, and lock block operation in the CSM 8 are similar to those of conventional EPROMs/EEPROMs.

As shown in FIG. 2, the CSM 8 is provided with the WP signal generator 9. The WP signal generator 9 generates a WP signal S102 so as to input to the WSM 3. The WSM S validates the WP state which is set in the block protect setting section 2 of each erase block 1. For example, as shown in FIG. 4, only when the WP signal S102 goes high (H), are erase and write operations are prohibited for the erase block 1 in which the write protect state is set in the block protect setting section 2 thereof. Otherwise, erase and write operations allowed for the erase block 1 regardless of the protect state setting in the block protect setting section 2 thereof.

Figure 5:
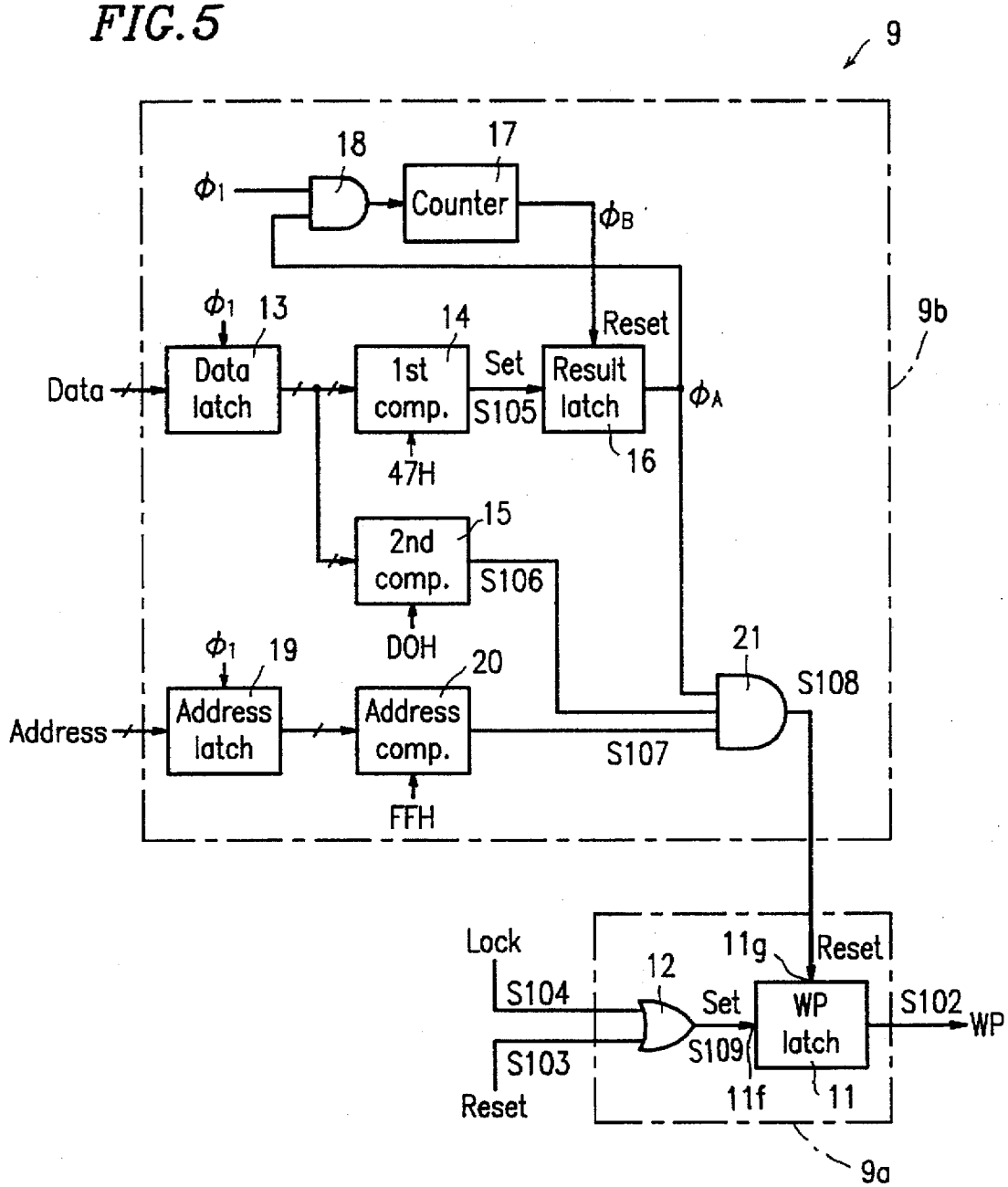
FIG. 5 is a schematic diagram illustrating an exemplary structure of the WP signal generator of the nonvolatile semiconductor memory device according to one embodiment of the present invention.

As shown in FIG. 5, the WP signal generator 9 includes a WP signal generating portion 9a and a WP release command identifying portion 9b. The WP signal generating portion 9a has a WP signal latch circuit 11 and an OR circuit 12.

Figure 7:
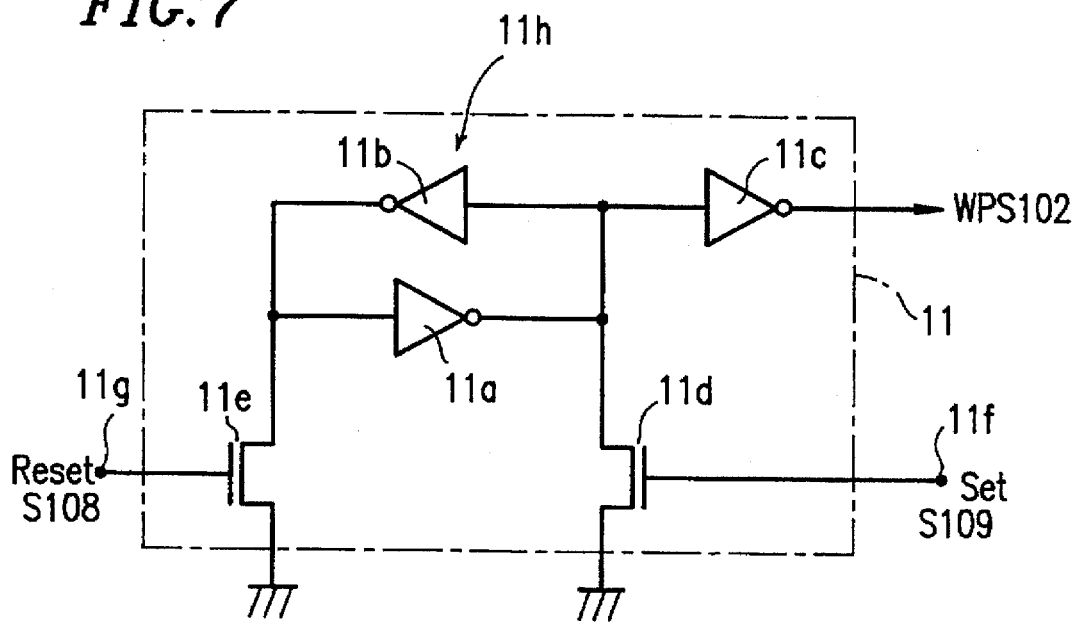
FIG. 7 is a diagram illustrating a structure of WP signal latch circuit.

As shown in FIG. 7, the WP signal latch circuit 11 includes two inverters 11a and 11b forming a flip-flop circuit 11h, an inverter 11c for inverting an output from the flip-flop circuit 11h so as to output the WP signal S102, and two N-channel MOSFETs 11d and 11e. A gate terminal of the MOSFET 11d is coupled to a set terminal 11f to which a set signal S109 is input. A gate terminal of the MOSFET 11e is coupled to a reset terminal 11g to which a reset signal S108 is input.

Accordingly, when the set signal S109 goes high so as to turn on the MOSFET 11d, the input of the inverter 11c goes low so that the WP signal S102 goes high. The WP signal S102 remains at the high level after the set signal S109 goes low. On the other hand, when the reset signal S108 goes high so as to turn on the MOSFET 11e, the output of the inverter 11a goes high so that the WP signal S102 goes low. The WP signal S102 remains at the low level after the reset signal S108 goes low.

As shown in FIG. 5, a lock signal S104 and the reset signal S103 are input to the OR circuit 12. The output (i.e., the set signal S109) of the OR circuit 12 is coupled to the set terminal 11f of the WP signal latch circuit 11. An output of the WP release command identifying portion 9b (i.e., the reset signal S108) is coupled to the reset terminal 11g of the WP signal latch circuit 11 in the write signal generating portion 9a.

The lock signal S104 goes high when the CSM 8 identifies a lock block command such as the data 77H described above. Accordingly, when the WP state is externally set in the block protect setting section 2 of a certain erase block 1, the WP signal latch circuit 11 is set so that the WP signal S102 goes high. Thus, the WP state set in the block protect setting section 2 is automatically activated.

The reset signal S103 goes high when the system is turned on or reset. Thus, the WP signal latch circuit 11 is set so that the WP signal S102 goes high when the system is turned on or reset. Accordingly, the protect state which was previously set in the block protect setting section 2 is automatically activated or validated when the system is turned on or reset so as to prevent the previous data from being erased or rewritten.

As shown in FIG. 5, the WP release command identifying portion 9b includes a data latch circuit 13, first and second data comparison circuits 14 and 15, a comparison result latch circuit 16, an AND circuit 18, a counter 17, an address latch circuit 19, an address comparing circuit 20, and a three-input AND circuit 21.

Figure 6:
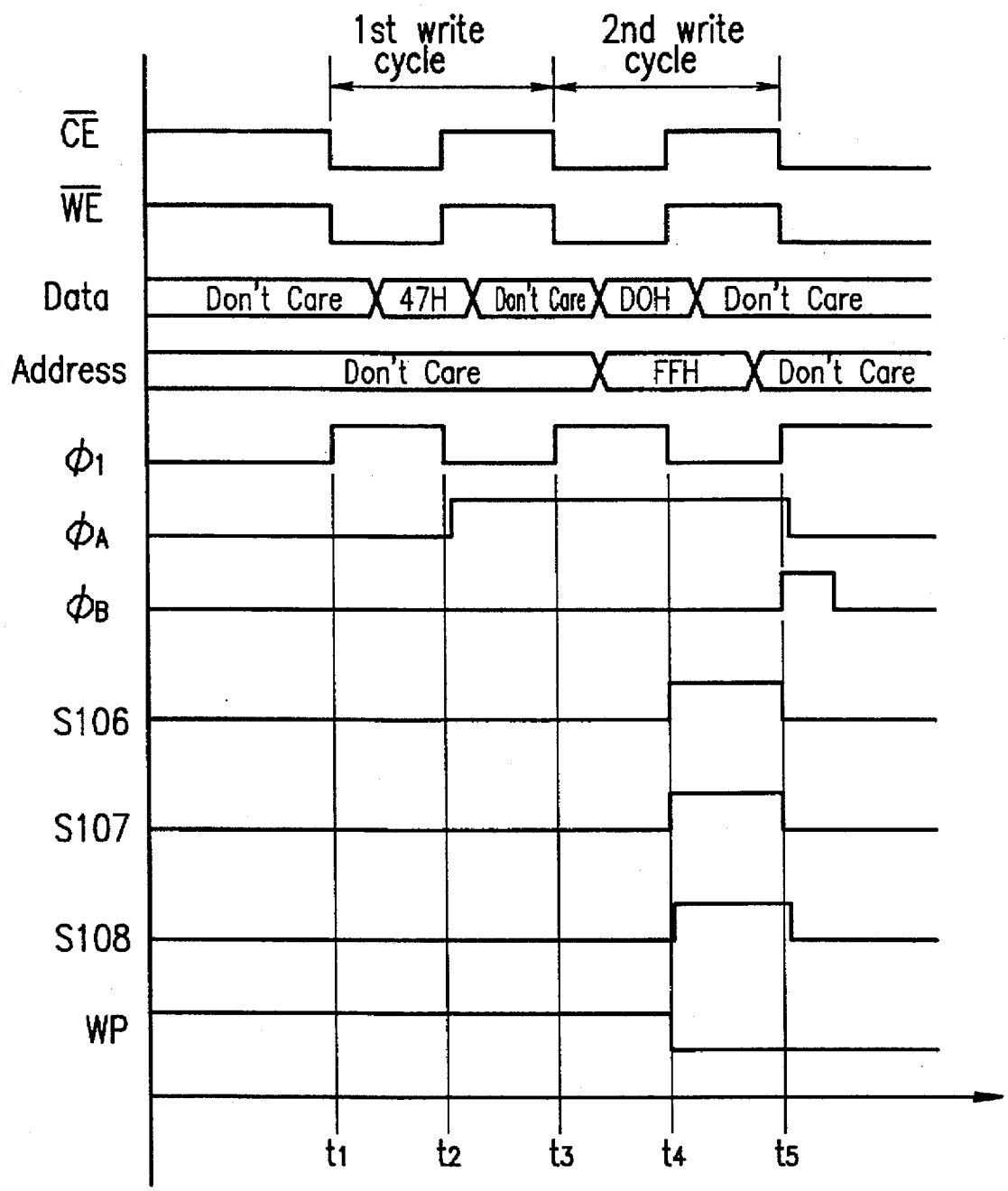
FIG. 6 is a timing chart illustrating operations of the WP signal generator shown in FIG. 5.

The data latch circuit 13 latches input data based on a timing signal $\phi_1$ which is externally input. As shown in FIG. 6, the timing signal $\phi_1$ is an inverted signal of the write enable signal WE-bar. The timing signal $\phi_1$ goes high in a first half of a write cycle (e.g., from time $t_1$ to $t_2$ and from time $t_3$ to $t_4$), and then returns low in a second half of the write cycle (e.g., from time $t_2$ to $t_3$ and from time $t_4$ to $t_5$).

Figure 8:
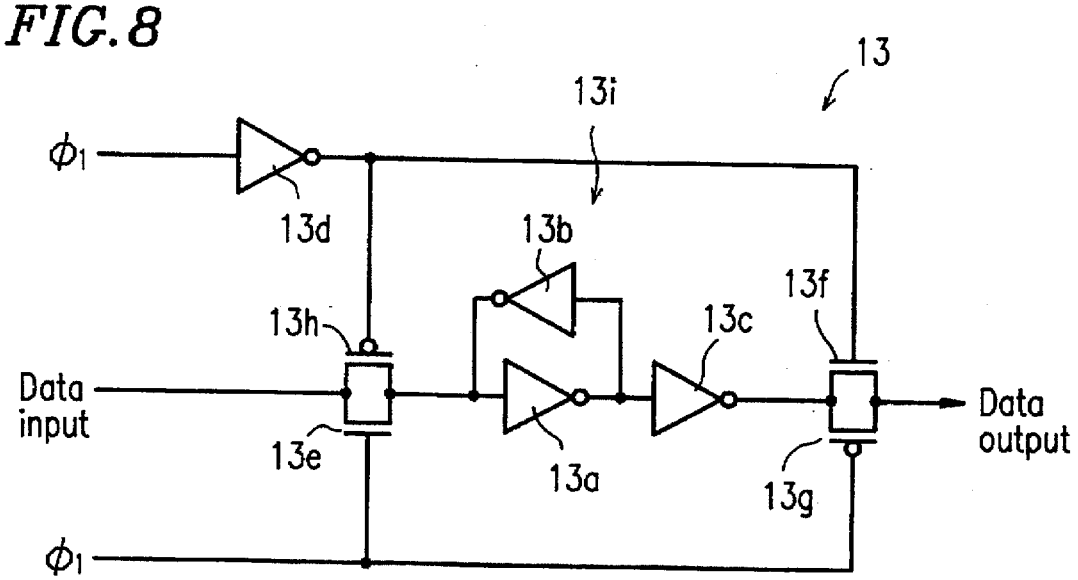
FIG. 8 is a diagram illustrating a structure of an one-bit portion of the data latch circuit.

FIG. 8 shows an one-bit portion of the data latch circuit 13. The data latch circuit 13 includes a plurality of the one-bit portions, the number of the one-bit portions being the same as the bit length of the input data. As shown in FIG. 8, each one-bit portion of the data latch circuit 13 includes two inverters 13a and 13b which form a flip-flop circuit 13i, an inverter 13c for inverting an output from the flip-flop circuit 13i, two N-channel MOSFETs 13e and 13f, two P-channel MOSFETs 13g and 13h, and an inverter 13d for inverting the timing signal $\phi_1$.

The timing signal $\phi_1$ is coupled to the input of the inverter 13d and respective gates of the NMOSFET 13e and the PMOSFET 13g. The output of the inverter 13d (i.e., the inverted timing signal $\phi_1$) is coupled to respective gates of the PMOSFET 13h and the NMOSFET 13f. The input data is coupled to the flip-flop circuit 13i via a pair of MOSFETs 13e and 13h. The output of the inverter 13c is coupled to an output terminal via a pair of MOSFETs 13g and 13f.

Accordingly, as shown in FIG. 6, when the timing signal $\phi_1$ goes high in a first half of a write cycle (e.g., from time $t_1$ to $t_2$ and from time $t_3$ to $t_4$), the MOSFETs 13e and 13h are turned on so that each bit of the input data is input to the flip-flop circuit 13i. When the timing signal $\phi_1$ returns low in a second half of the write cycle (e.g., from time $t_2$ to $t_3$ and from time $t_4$ to $t_5$), the MOSFETs 13e and 13h are turned off so that the input bit is latched in the flip-flop circuit 13i. And at the same time, the MOSFETs 13f and 13g are turned on to output the latched bit of data.

Figure 9:
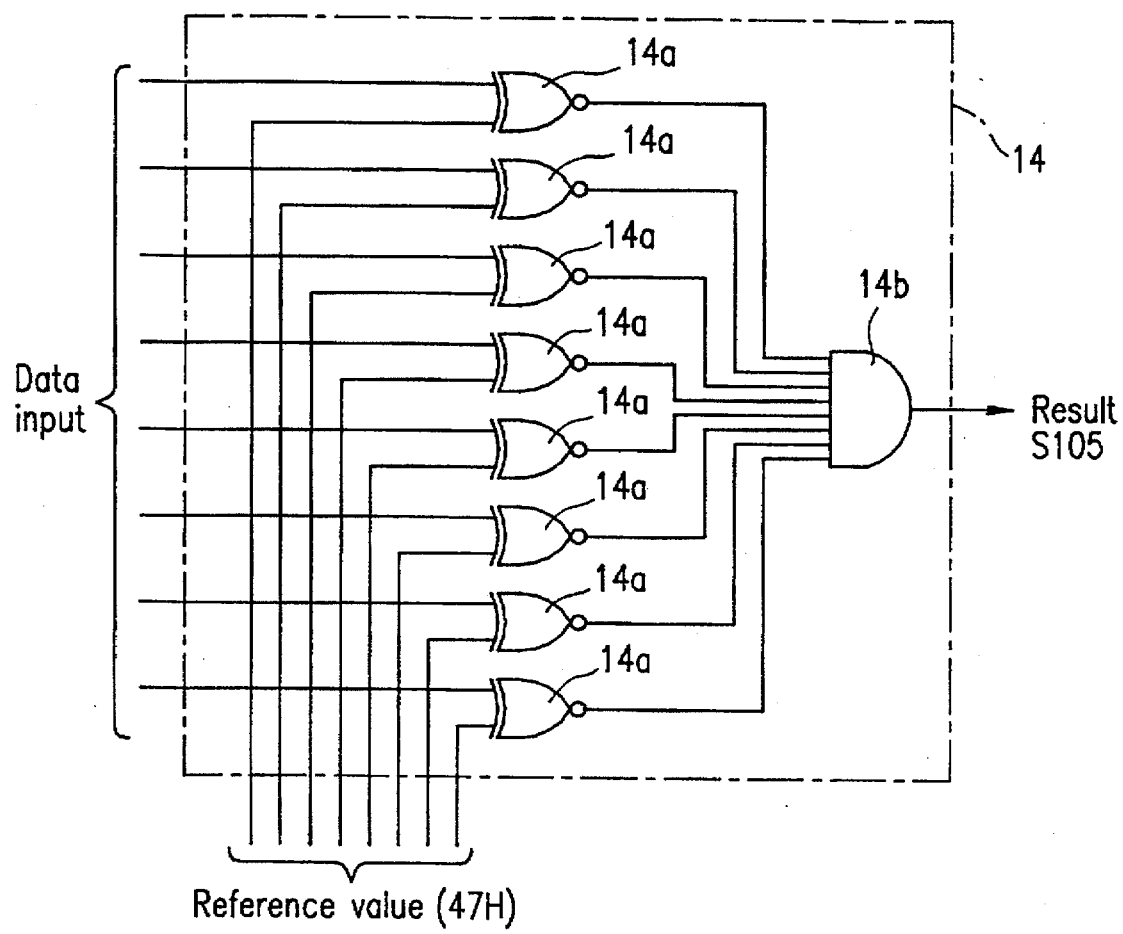
FIG. 9 is a diagram illustrating a structure of the first data comparing circuit.

As shown in FIG. 5, each output bit is supplied to the first and second data comparing circuits 14 and 15. As shown in FIG. 9, the first data comparing circuit 14 includes a plurality of EX-NOR circuits 14a and a multi-input AND circuit 14b for logically ANDing the respective outputs of the EX-NOR circuits 14a. The number of EX-NOR circuits 14a is the same as the number of the bit length of the input data. In this example, since input data and addresses are represented by eight bits, the number of the EX-NOR circuits 14a is eight, as shown in FIG. 9.

One input terminal of a respective EX-NOR circuit 14a is supplied with the corresponding bit of the input data from the data latch circuit 13. The other input terminal of the respective EX-NOR circuit 14a is supplied with a corresponding bit of a predetermined reference value, for example, a data value of 47H as shown in FIG. 9. Accordingly, when the input data matches the predetermined value, the output of each EX-NOR circuit 14a goes high so that the output (comparison result) S105 of the AND circuit 14b also goes high. In the case where even one single bit of the input data is different from the corresponding bit of the reference data, the corresponding output of the EX-NOR circuit 14a goes low so that the output S105 of the AND circuit 14b also goes low. Thus, the output S105 of the AND circuit 14b represents a result of the comparison of the input data and the reference value, which goes high only when the input data completely matches the reference value.

The structure of the second data comparing circuit 15 is the same as that of the first data comparing circuit 14 other than an input predetermined reference value. The predetermined reference value in the second data comparing circuit 15 is, for example, D0H as shown in FIG. 5. The output (comparison result signal) S106 of the second comparing circuit 15 goes high only when the input data matches D0H.

Figure 10:
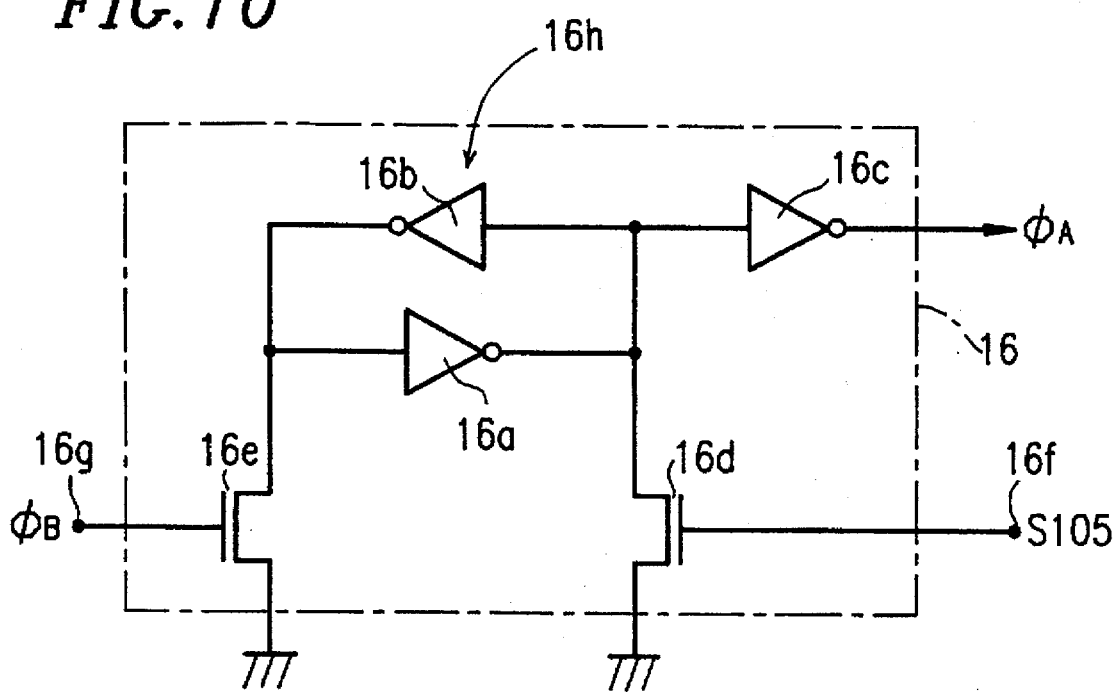
FIG. 10 is a diagram illustrating a structure of the comparison result latch circuit.

The comparison result S105 is input as a set signal to a set terminal of the comparison result latch circuit 16. As shown in FIG. 10, the comparison result latch circuit 16 has a structure similar to that of the WP signal latch circuit 11. The comparison result latch circuit 16 includes two inverters 16a and 16b forming a flip-flop circuit 16h, an inverter 16c for inverting an output from the flip-flop circuit 16h to output a latched comparison result signal $\phi_A$, and two N-channel MOSFETs 16d and 16e. A gate terminal of the MOSFET 16d is coupled to a set terminal 16f to which the set signal S105 is input. A gate terminal of the MOSFET 16e is coupled to a reset terminal 16g to which a count-up signal $\phi_B$ is input from the counter 17.

Accordingly, when the signal S105 goes high to turn on the MOSFET 16d, the input of the inverter 16c goes low so that the comparison result signal $\phi_A$ goes high. The comparison result signal $\phi_A$ remains at the high level after the set signal S105 goes low until the comparison result latch circuit 16 is reset by the count-up signal $\phi_B$. When the count-up signal $\phi_B$ goes high so as to turn on the MOSFET 16e, the output of the inverter 16a goes high so that the comparison result signal $\phi_A$ goes low. The comparison result signal $\phi_A$ remains at the low level after the count-up signal $\phi_B$ goes low.

As shown in FIG. 6, when the data latch circuit 13 latches and outputs the data having a value of 47H by the timing signal $\phi_1$ going low, as described above, at the time $t_2$ in a first write cycle, the set signal S105 output from the first data comparing circuit 14 goes high. As a result, the comparison result signal $\phi_A$ output from the comparison result latch circuit 16, which represents a previous comparison result in the first write cycle, goes high slightly after the time $t_2$ in the second write cycle.

The counter circuit 17 is supplied with the timing signal $\phi_1$ via the AND circuit 18 during the previous comparison result signal $\phi_A$ is at the high level. The counter circuit 17 counts rising of the timing signal $\phi_1$ twice, and then makes the count-up signal $\phi_B$ go high. Accordingly, as shown in FIG. 6, after the previous comparison result signal $\phi_A$ goes high slightly after the time $t_2$, the counter circuit 17 counts the rising of the timing signal $\phi_1$ at time $t_3$ and time $t_5$. At the time $t_5$ when the counter circuit 17 has counted the rising twice, the count-up signal $\phi_B$ goes high, followed by the previous comparison result signal $\phi_A$ going low.

Figure 11:
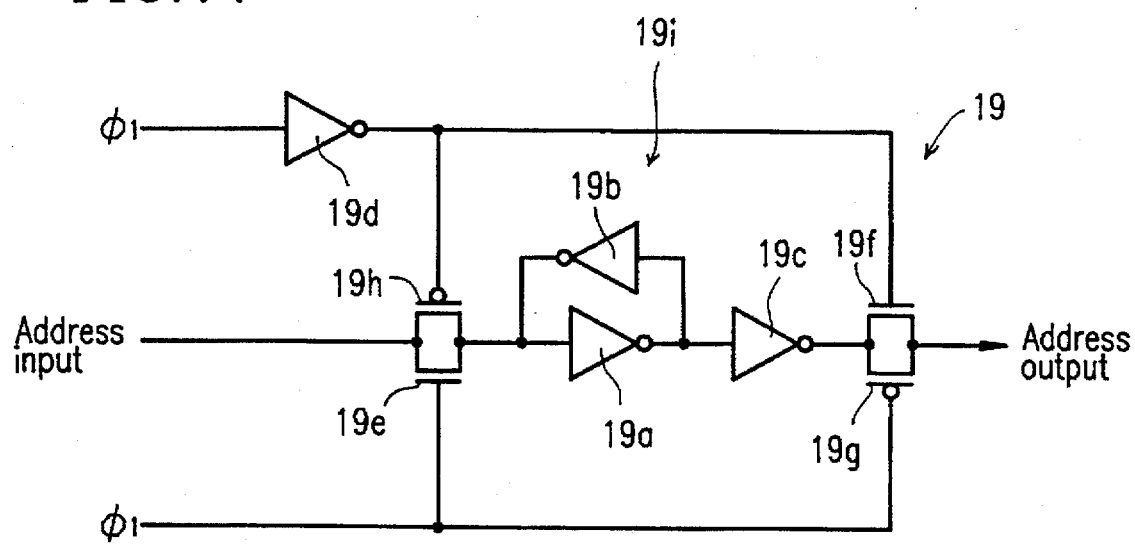
FIG. 11 is a diagram illustrating a structure of an one-bit portion of the address latch circuit.

As shown in FIG. 5, in the WP release command identifying portion 9b, the address latch circuit 19 latches the input address based on the timing signal $\phi_1$. FIG. 11 shows a one-bit portion of the address latch circuit 19. The address latch circuit 19 includes a plurality of the one-bit portions, the number of the one-bit portions being the same as the bit length of the input address. As shown in FIG. 11, each one-bit portion of the address latch circuit 19 includes two inverters 19a and 19b forming a flip-flop circuit 19i, an inverter 19c for inverting an output from the flip-flop circuit 19i, two N-channel MOSFETs 19e and 19f, two P-channel MOSFETs 19g and 19h, and an inverter 19d for inverting the timing signal $\phi_1$.

The timing signal $\phi_1$ is coupled to the input of the inverter 19d and respective gates of the NMOSFET 19e and the PMOSFET 19g. The output of the inverter 19d (i.e., the inverted timing signal $\phi_1$) is coupled to respective gates of the PMOSFET 19h and the NMOSFET 19f. The input data is coupled to the flip-flop circuit 19i via a pair of the MOSFETs 19e and 19h. The output of the inverter 19c is coupled to an output terminal via a pair of MOSFETs 19g and 19f.

As shown in FIG. 6, as in the same manner as the data latch circuit 13, the address latch circuit 19 latches and outputs the input address at time $t_2$ in the first cycle and time $t_4$ in the second cycle. The latched and output address is supplied to the address comparing circuit 20.

Figure 12:
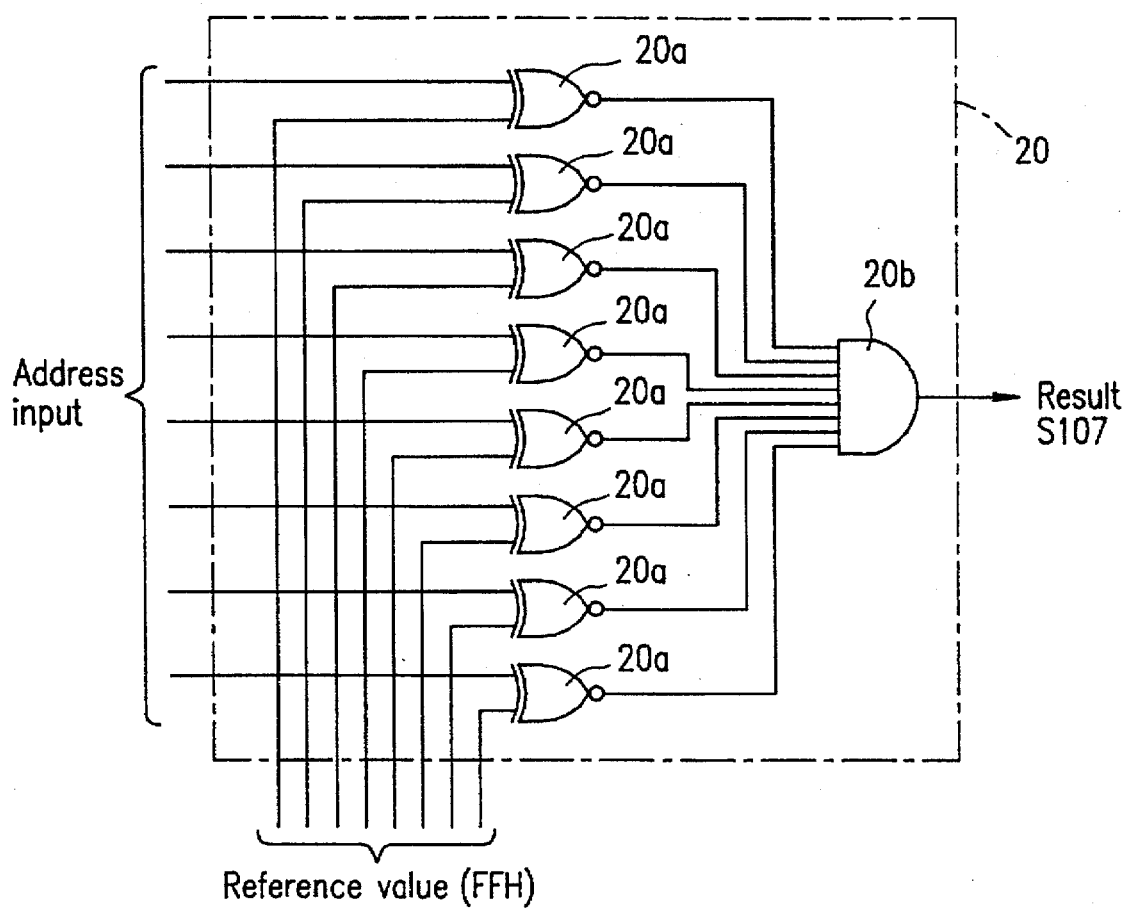
FIG. 12 is a diagram illustrating a structure of the address comparing circuit.

The structure of the address comparing circuit 20 is the same as that of the first and second data comparing circuits 14 and 15 other than a predetermined input reference value, as shown in FIG. 12. The predetermined reference value in the address comparing circuit 20 is, for example, FFH as shown in FIG. 12. The output (comparison result signal) S107 of the address comparing circuit 20 goes high only when the input data matches FFH.

As shown in FIG. 5, the previous comparison result signal $\phi_A$ and the comparison result signals S106 and S107 are input to the three-input AND circuit 21. The output S108 of the three-input AND circuit 21 is applied to the reset terminal 11g of the WP signal latch circuit 11 in the WP signal generating portion 9a. Accordingly, as shown in FIG. 6, the previous comparison result signal $\phi_A$ goes high slightly after time $t_2$ by detecting the data having the value 47H input in the first cycle, and the comparison result signals S106 and S107 go high at time $t_4$ by detecting the data having the value d0H and the address having the value FFH, respectively, both input in the second cycle. As a result, the output of the thee-input AND circuit 21 goes high so as to reset the WP latch circuit 11. Thus, the WP signal S102 goes low so as to be inactive, whereby the protect state set in the block protect setting portion 2 becomes invalid.

The output S108 of the three-input AND circuit 21 goes high after time t s when the previous comparison result signal $\phi_A$ returns low, while the WP signal S102 remains low until the set signal S109 having the high level is input to the set terminal of the WP signal latch circuit 11

As described above, the nonvolatile semiconductor memory device 100 identifies the WP release command shown in FIG. 13 by the WP signal generator 9 provided in the CSM 8. Each bus cycle is made a write bus cycle by the chip enable signal CE-bar and the write enable signal WE-bar both going low (active). The WP release command is identified in the case where the data 47H is input in the first write cycle and the address FFH and the data d0H are input in the second write cycle, so that the WP signal S102 output from the WP signal generator 9 goes low (inactive). The nonvolatile semiconductor memory device 100 does not care of an address input in the first write cycle, since the address input during the first write cycle is not used for the identification of the WP release command. When the WP signal S102 goes low so as to make the WP state in the block protect setting section 2 invalid, erase/write operations are allowed for the corresponding erase block 1 regardless of the WP state.

As described above, in the nonvolatile semiconductor memory device 100 according to this embodiment of the present invention, the WP signal S102 which activates the WP state for prohibiting the erase/write operation of the erase block 1 is generated in the WP signal generator provided in the CSM 8, and the WP state is made invalid by the WP release command. Thus, the nonvolatile semiconductor memory device 100 requires no additional IC pin or input terminal for externally inputting the WP signal WP-bar.

In addition, the WP signal S102 automatically goes high (activated) when the protect state is set in the block protect setting section 2 in the erase block 1 by the lock block command. This protects the important data from being erased by mistake such as a failure to activate the WP signal WP-bar after the lock block command is issued. Furthermore, the WP signal is always activated when the source supply of nonvolatile semiconductor memory device 100 is turned on or the whole system thereof is reset, thereby preventing the data from being erased by forgetting the previous WP state setting.

In this embodiment, the WP release command is identified by detecting a predetermined combination of the data in the first and second write cycles (e.g. 47H and d0H, as shown in FIG. 13) and a predetermined address of the data in the second write cycle (e.g., FFH, as shown in FIG. 13). The WP release command and the commands shown in FIG. 3 are the same as two successive write operations for a CPU of the system. Thus, the command may be issued by chance in the case where the write operations having the data (and address) the same as those of the command are performed due to bugs or a runaway of program execution. However, by using a specific combination of two specific values of the input data and one specific address in order to identify the WP release command, the probability that the write operations having the data and address the same as those of the WP release command are performed is very small. Thus, accidental erase/rewrite operations are well prohibited according to this embodiment.

FIG. 14 shows other examples of the WP release (WPR) command. For the first command example (WPR-1), addresses in the first and second write cycles are not cared. In this case, the address latch circuit 19 and the address comparing circuit 20 can be omitted so as to simplify the command system and structure of the WP signal generator 9. Such a WP release command can be used for the system in which an accidental ease/rewrite of the data does not cause a serious problem, since the WP release command of this type is simply the same as two successive write operations for the CPU of the system. Thus, the WP release command and a successive data write command or block erase command might be issued, by accidentally performing successive write operations having the same data as those of the commands.

The second command example (WPR-2) shown in FIG. 14 is identified by detecting a predetermined combination of data in the first and second write cycles (e.g. 47H and d0H) and a predetermined address in the first write cycle (e.g., FFH). As is in the case of the WP release command shown in FIG. 13, by using two specific values of the input data and one specific address in order to identify the WP release command, the probability that the write operations having the data, the address, and the order thereof the same as those of the WP release command are performed is very small. Thus, accidental erase/rewrite operations are well prohibited.

The third command example (WPR-3) shown in FIG. 14 is identified by detecting a predetermined combination of the data in the first and second write cycles (e.g. 47H and d0H) and a predetermined combination of addresses in the first and second write cycles (e.g., FFH and FFH). By using two specific values of the input data and two specific addresses thereof in order to identify the WP release command, the probability that the write operations having the data, the addresses, and the order thereof the same as those of the WP release command are performed is very small. Thus, accidental erase/rewrite operations are very well prohibited.

A WP release command such as the third command example can be implemented in the system by providing an additional AND circuit for ANDing the first comparing circuit 14 and the address comparing circuit 20 so as to input the resultant signal to the set terminal of the comparison result latch circuit 16. The system implementing this type of WP release command can further reduce the probability of an accidental erase/rewrite of data due to an accidental issuance of the WP release command.

The WP release command can be identified using a specific data value or a combination of a specific data value and a specific address thereof in one write cycle in the case where the accidental erase/rewrite of the data does not cause a big problem. Alternatively, the WP release command can be identified using specific data values or a combination of specific data values and specific addresses in three write cycles or more. By increasing the number of the write cycles used in the identification of the WP release command, the probability of an accidental erase/rewrite of the data can be further reduced. However, the more the number of write cycles increases, the more complicated the configuration of the system becomes and the longer the execution time of the WP release command becomes.

EXAMPLE 2

Figure 15:
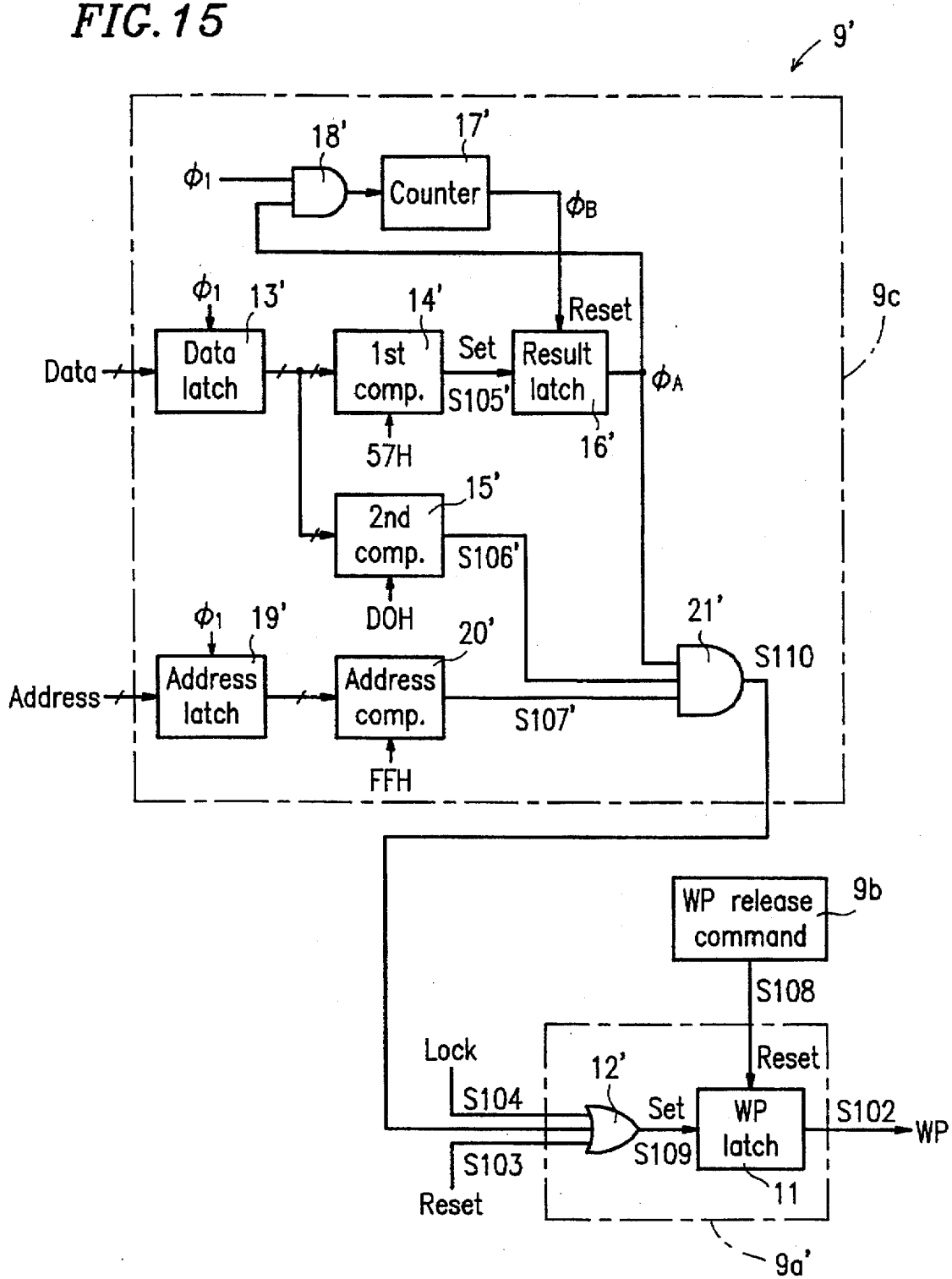
FIG. 15 is a schematic diagram illustrating an exemplary structure of the WP signal generator of the nonvolatile semiconductor memory device according to another embodiment of the present invention.

FIG. 15 shows a WP signal generator 9' which is used in another embodiment of the nonvolatile semiconductor memory device according to the present invention. The overall structure of the nonvolatile semiconductor memory device of this embodiment is the same as that of the nonvolatile semiconductor memory device 100 shown in FIG. 2. Elements of the WP signal generator 9' corresponding to those of the WP signal generator 9 are denoted by the same numerical references.

In the nonvolatile semiconductor memory device 100 of the first embodiment, once the WP signal is made inactive, the WP signal cannot be made active until a new WP state is set by the lock block command, the system is reset, or the system is rebooted (turned on again). In this embodiment, a WP set command for making the WP signal active is provided.

As shown in FIG. 15, the WP signal generator 9' includes a WP signal generating portion 9a', a WP release command identifying portion 9b', and a WP set command identifying portion 9c. The WP signal generating portion 9a' includes a three-input NOR circuit 12' and an WP latch circuit 11. The structure of the latch circuit 11 is the same as that shown in FIG. 7. The structure of the WP release command identifying portion 9b is the same as that shown in FIG. 5 of the first embodiment.

The WP set command identifying portion 9c has a structure similar to that of the WP release command identifying portion 9b shown in FIG. 5. As shown in FIG. 15, the WP set command identifying portion 9c includes a data latch circuit 13', first and second data comparison circuits 14' and 15', a comparison result latch circuit 16', an AND circuit 18', a counter 17', an address latch circuit 19', an address comparison circuit 20', and a three-input AND circuit 21'.

As shown in FIG. 15, input data is supplied to the data latch circuit 13' and an input address is supplied to the address latch circuit 19'. The data latch circuit 13' and the address latch circuit 19' latch the input data and the input address in the same manner as the data latch circuit 13 and the address latch circuit 19 in the first embodiment as described above, respectively. Each output bit of the data latch circuit 13' is supplied to the first and second data comparing circuits 14' and 15'. Each output bit of the address latch circuit 19' is input to the address comparing circuit 20'.

Predetermined reference values, for example, 57H, d0H and FFH are input to the first data comparing circuit 14', the second data comparing circuit 15' and the address comparing circuit 20', respectively. The reference value (57H) input to the first data comparing circuit 14' is the only difference between the WP set command identifying portion 9c and the WP release command identifying portion 9b. The reference values input to the second data comparing circuit 15' and the address comparing circuit 20' are the same as those of the second comparing circuit 15 and the address comparing circuit 20 in the WP release command identifying portion 9b (shown in FIG. 5).

The respective structures and functions of the first and second data comparing circuits 14' and 15' and the address comparing circuit 20' are the same as those of the first and second data comparing circuits 14 and 15 and the address comparing circuit 20 of the WP release command identifying portion 9b (shown in FIGS. 5, 9, and 12). Accordingly, respective outputs S105', S106' and S107' of the first and second data comparing circuits 14' and 15' and the address comparing circuit 20' go high when the input values of the data or address match the predetermined reference values of 57H, d0 H and FFH, respectively. The output (comparison result) S105' of the first comparing circuit 14' is input to the result latch circuit 16'.

In the same way as the WP release command identifying circuit 9b, a comparison result signal $\phi_A$ which is latched and output from the result latch circuit 16', the comparison result signal S106' output from the second comparing circuit 15', and the address comparison result signal S107' are supplied to the three-input AND circuit 21'. An output (WP set signal) S110 of the three-input AND circuit 21' is input to one terminal of the three-input NOR circuit 12' of the WP signal generating portion 9a'. The reset signal S103 and the lock signal S104 are also input to the remaining two terminals of the NOR circuit 12'.

Consequently, the WP signal generating portion 9a' makes the WP signal S102 active when one of the WP set signal S110, the reset signal S103 and the lock signal S104 goes high. The reset signal S103 and the lock signal S104 are the same as those described above in the first embodiment. The WP signal generating portion 9a' makes the WP signal S102 low when the reset signal S108 is input from the WP release command identifying portion 9b as described above in the first embodiment.

Figure 17:
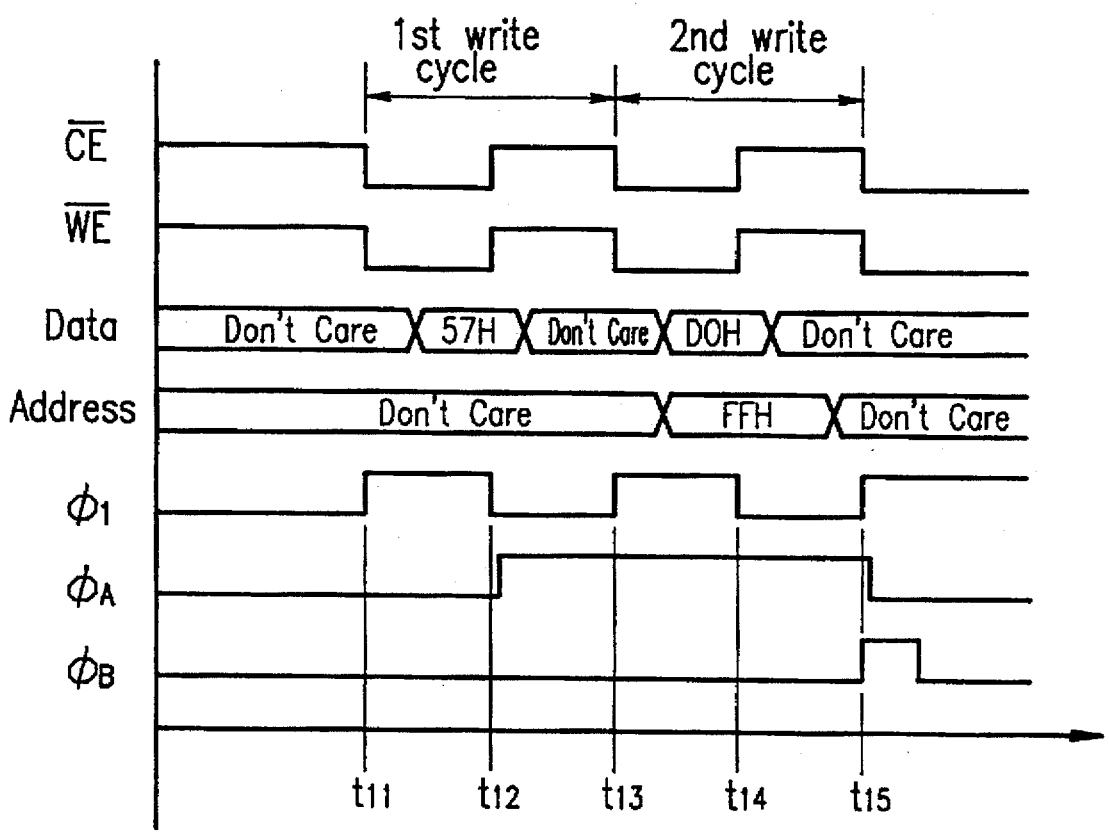
FIG. 17 is a timing chart illustrating operations of the WP signal generator shown in FIG. 15.

FIG. 16 shows the WP set command used in this embodiment. FIG. 17 shows the operation of the WP set command identifying portion 9c. The WP set command is identified by the WP set command identifying portion 9c as follows.

Each bus cycle is made a write bus cycle by the chip enable signal CE-bar and the write enable signal WE-bar both going low (active). In a first write cycle, the timing signal $\phi_1$ goes high at the time $t_{11}$ and then the data having a value of 57H is input. The data latch circuit 13' latches the input data of 57H when the timing signal $\phi_1$ goes low at the time $t_{12}$.

As shown in FIG. 17, when the data latch $t_{12}$. circuit 13' outputs the data having the value of 57H by the timing signal $\phi_1$ going low at the time $t_{12}$ in the first write cycle, the set signal S105'(not shown in FIG. 17) output form the first data comparing circuit 14' goes high. As a result, the previous comparison result signal $\phi_A$ output from the comparison result latch circuit 16', which represents the comparison result in the first write cycle, goes high slightly after time $t_{12}$. The comparison result signal $\phi_A$ remains high after the set signal S105' goes low.

In the second write cycle, the chip enable signal CE-bar and write enable signal WE-bar go low (active) again and the timing signal $\phi_1$ goes high at time $t_{13}$ and then the data having a value of d0H and the address FFH of the data are input. The data latch circuit 13' latches the input data of d0H, and the address latch circuit 19' latches the input address of FFH, respectively, when the timing signal $\phi_1$ goes low at time $t_{14}$.

As shown in FIG. 17, the data latch circuit 13' latches and outputs the data having the value of d0H and the address latch circuit 19' latches and outputs the address having the value of FFH at time $t_{14}$ when the timing signal $\phi_1$ goes low in the second write cycle. Thus, the comparison result signal S106' output form the second data comparing circuit 15' and the address comparison result signal S107' output from the address comparing circuit 20' go high. Although the output S105' of the first data comparing circuit 14' goes low at this time, the previous comparison result signal $\phi_A$ remains high until the count-up signal $\phi_B$ goes high to reset the result latch circuit 16' at time $t_{15}$. Consequently, the signals $\phi_A$, S106' and S107' go high during the time period from time $t_{14}$ to $t_{15}$, so that the output S110 of the three-input AND circuit 21' goes high. Thus, the output S110 from the WP set command identifying portion 9c makes the set signal S109 high, which is output from the three-input NOR circuit 12' in the WP signal generating portion 9a', so as to set the WP latch circuit 11. As a result, the WP signal S102 goes high (active).

In a similar manner to that of the WP release command identifying portion 9b, the counter circuit 17' is supplied with the timing signal $\phi_1$ via the AND circuit 18'. During the time period when the previous comparison result signal, $\phi_A$ is at the high level, the counter circuit 17' counts the rising of the timing signal $\phi_1$ twice, and then makes the count-up signal $\phi_B$ go high. Accordingly, as shown in FIG. 16, after the previous comparison result signal $\phi_A$ goes high slightly after time $t_{12}$, the counter circuit 17' counts the rising of the timing signal $\phi_1$ at time $t_{13}$ and time $t_{15}$. At time $t_{15}$ when the counter circuit 17' has counted the rising twice, the count-up signal $\phi_B$ goes high, followed by the previous comparison result signal $\phi_A$ going low.

The WP signal S102 output from the WP signal generator 9' goes low (inactive) when the WP release command, i.e., the combination of the data 47H input in the first write cycle and the data d0H and the address FFH thereof input in the second write cycle, is identified by the WP release command identifying portion 9b. This makes the protect state which is set in the block protect setting section 2 invalid so as to allow the erase/write operation for the corresponding erase block 1 regardless of the protect state, as shown in FIG. 4.

After that, when the WP set command, i.e., the combination of the data 57H input in one write cycle and the data d0H and the address FFH thereof in the next write cycle, is identified by the WP set command identifying portion 9c, the WP signal S102 output from the WP signal generator 9' returns high (active). Thus, the protect state set in the block protect setting section 2 becomes valid again so that the erase/write operation for the corresponding erase block 1 is prohibited, as shown in FIG. 4.

As described above, the nonvolatile semiconductor memory device according to the second embodiment identifies the WP release command shown in FIG. 13 and the WP set command shown in FIG. 16 by the WP signal generator 9'. The WP signal S102 which activates the protect state for prohibiting the erase/write operation of the erase block 1 is generated in the WP signal generator 9' provided in the CSM 8, and the protect state is made invalid by the WP release command. Thus, the nonvolatile semiconductor memory device requires no additional IC pin or input terminal for externally inputting the WP signal WP-bar.

In addition, the WP signal S102 automatically goes high (active) when the protect state is set in the block protect setting section 2 in the erase block 1 by the lock block command. This protects important data from being erased by mistake such as due to a failure to activate the WP signal WP-bar after the lock block command is issued. The WP signal S102 is always activated when the source supply of nonvolatile semiconductor memory is turned on or the whole system thereof is reset, preventing the data from being erased by forgetting the previous protect state setting. Furthermore, the WP signal S102 can be activated by inputting the WP set command.

In this embodiment, since the WP signal S102 can be activated by the WP set command, the automatic activation of the WP signal S102 by the lock block command may be omitted.

In this embodiment, the WP set command is identified by a predetermined combination of specific values of data in the first and second write cycles (e.g. 57H and d0H, as shown in FIG. 16) and a specific value of the address input in the second write cycle (e.g., FFH, as shown in FIG. 16). By using two specific values of data and one specific value of the address in order to identify the WP set command, the probability that the write operations having the same data and address as those of the WP set command being performed is very small. Thus, accidental erroneous operations are well prevented against, according to this embodiment.

The WP set command can be assigned to a different combination of the data and/or address as shown in FIG. 18, as is in the case of the WP release command shown in FIG. 14. FIG. 18 shows other examples of the WP set (WPS) command. For the first command example (WPS-1), addresses in the first and second write cycles are not cared. In this case, the address latch circuit 19' and the address comparing circuit 20' can be omitted to simplify the command system and structure of the WP signal generator 9'. Such a WP set command can be used for the system in which an accidental issuance of commands does not cause a serious problem.

The second command example (WPS-2) shown in FIG. 18 is identified by a predetermined combination of specific values of data in the first and second write cycles (e.g. 57H and d0H) and a specific value of the address in the first write cycle (e.g., FFH). As is in the case of the WP set command shown in FIG. 16, by using two specific values of the input data and one specific address in order to identify the WP set command, the probability that the write operations having the same data and address as those of the WP set command being performed in the same order is very small. Thus, accidental issuance of the WP set command is well prevented against.

The third command example (WPS-3) shown in FIG. 18 is identified by a predetermined combination of specific values of data in the first and second write cycles (e.g. 57H and d0H) and specific values of the address in the first and second write cycles (e.g., FFH and FFH). By using two specific values of input data and two specific values of the addresses thereof in order to identify the WP set command, the probability that the write operations having the same data and addresses thereof as those of the WP set command being performed in the same order is very small. Thus, accidental issuance of the WP set command is very well prevented against.

A WP set command such as the third command example can be implemented in the system by providing an additional AND circuit for ANDing the first comparing circuit 14' and the address comparing circuit 20' so as to input the resultant signal to the set terminal of the comparison result latch circuit 16'. The system implementing this type of WP set command can further reduce the probability of an operation error due to accidental issuance of the WP set command.

The WP set command can be identified using a specific value of data, or a combination of specific values of data and an address in one write cycle in the case where the erroneous operation does not cause a big problem. Alternatively, the WP set command can be identified using a combination of specific values of data and/or specific values of addresses in three write cycles or more. By increasing the number of write cycles used for the identification of the WP set command, the probability of accidental issuance of the WP set command can be further reduced. However, the more the number the write cycle used for the identification increases, the more complicated the configuration of the system becomes and the longer the execution time of the WP set command becomes.

EXAMPLE 3

Figure 19:
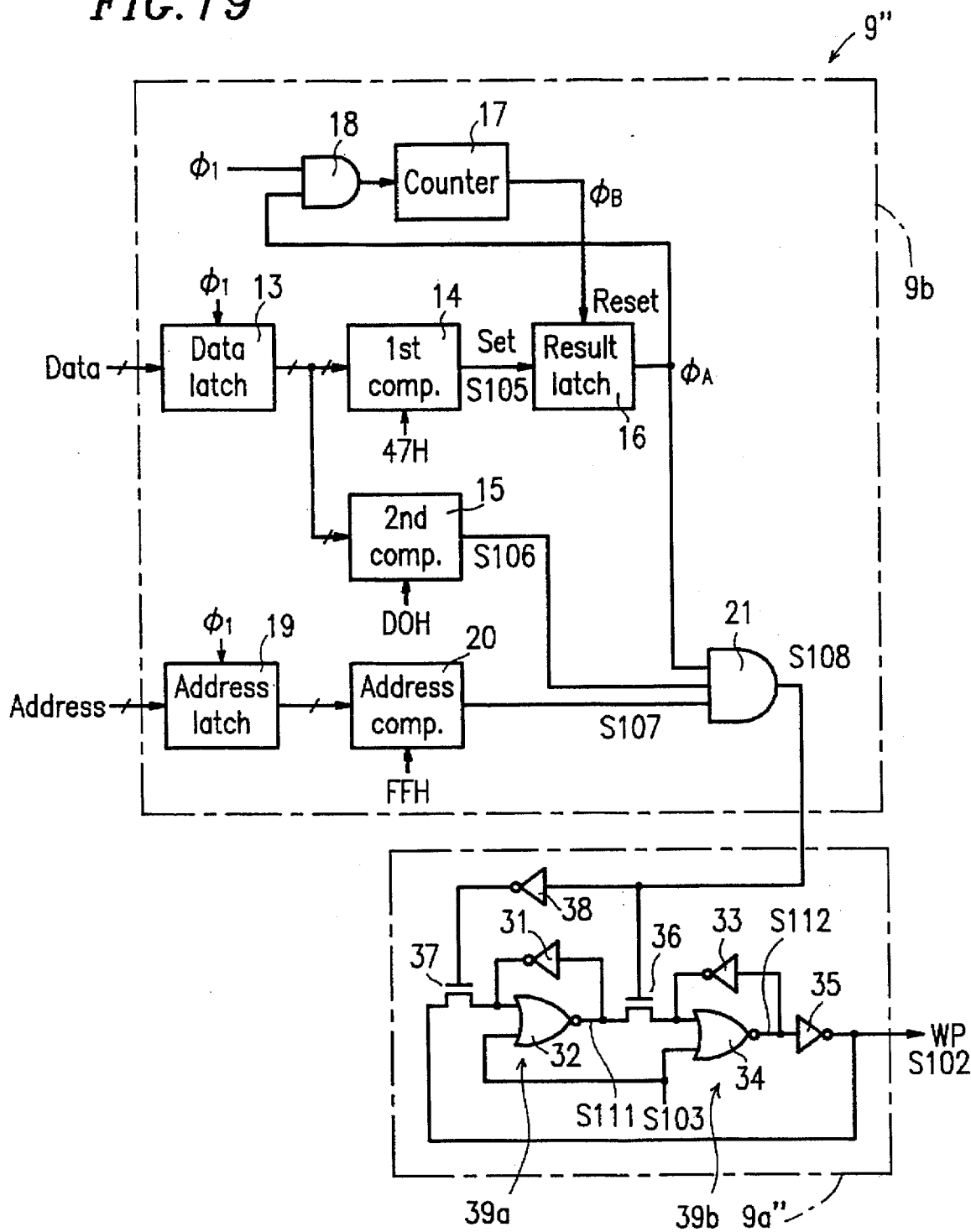
FIG. 19 is a schematic diagram illustrating an exemplary structure of the WP signal generator of the nonvolatile semiconductor memory device according to another embodiment of the present invention.

FIG. 19 shows a WP signal generator 9" which is used in another embodiment of the nonvolatile semiconductor memory device according to the present invention. The overall structure of the nonvolatile semiconductor memory device of this embodiment is the same as that of the nonvolatile semiconductor memory device 100 shown in FIG. 2. Elements of the WP signal generator 9" corresponding to those of the WP signal generator 9 are denoted by the same numerical references.

In the nonvolatile semiconductor memory device of the first and second embodiments, the commands for activating or inactivating the WP signal are provided separately. That is, the lock block command, the WP set command and the WP release command are provided as different commands. In this embodiment, activation and inactivation of the WP signal is controlled by toggling a single command. In this embodiment, the WP release command is used as the toggling command.

As shown in FIG. 19, the WP signal generator 9" includes a write signal generating portion 9a" and a WP release command identifying portion 9b. An output signal S108 of the WP release command identifying portion 9b is input to the WP signal generating portion 9a". The WP signal generating portion 9a" includes an inverter 31 and a NOR circuit 32 which form a first flip-flop circuit 39a, an inverter 33 and a NOR circuit 34 forming a second flip-flop circuit 39b, an inverter 35 for inverting an output of the NOR circuit 34, two N-type MOSFETs 36 and 37, and an inverter 38 for inverting the signal S108 input from the WP release command identifying portion 9b.

As shown in FIG. 19, the signal S108 is coupled to the inverter 38 and a gate of the MOSFET 36. The output of the inverter 38 is coupled to the gate of the MOSFET 37. The output of the inverter 35 is coupled to one input of the NOR circuit 32 via the MOSFET 37. The output of the NOR circuit 32 is coupled to one input of the NOR circuit 34 via the MOSFET 36. The respective other inputs of the NOR circuits 32 and 34 are supplied with the reset signal S103.

In usual operations without inputting a specific command (i.e., the WP release command), the signal S108 output from the three-AND circuit 21 remains low. Thus, the MOSFET 36 is turned off while the MOSFET 37 is turned on. When the system is turned on or reset so that the reset signal S103 goes high, an output S112 of the NOR circuit 34 goes low so that the WP signal S102 goes high (active). At the same time, the WP signal S102 is coupled to one input of the NOR circuit 32 via the MOSFET 37 so that the output S111 of the NOR circuit 32 goes low. The reset signal S103 returns low after the system is turned on or reset.

When the WP release command is identified by the WP release command identifying portion 9b under the condition in which the WP signal S102 is active, the signal S108 goes high so as to turn on the MOSFET 36 and to turn off the MOSFET 37. Accordingly, the output S111 remains low, and the output S111 is supplied to the NOR circuit 34 via the MOSFET 36. Thus, the output S112 of the NOR circuit 34 goes high so that the WP signal S102 goes low (inactive). When the signal S108 returns low so as to turn on the MOSFET 37 and turn off the MOSFET 36, the inactive WP signal S102 is supplied to the NOR circuit 32 via the MOSFET 37 so that the output S111 of the NOR circuit 32 goes high. However, the output S112 of the NOR circuit 34 remains high since the MOSFET 36 is turned off and the output S112 (high level) is supplied to the NOR circuit 34 via the inverter 33 (i.e., the low level signal). Thus, the WP signal S102 remains low.

Then, the WP release command is identified by the WP release command identifying portion 9b again so that the signal S108 goes high so as to turn on the MOSFET 36 and to turn off the MOSFET 37. Accordingly, the output S111 remains high, and the output S111 is supplied to the NOR circuit 34 via the MOSFET 36. Thus, the output S112 of the NOR circuit 34 goes low so that the WP signal S102 goes high (active). When the signal S108 returns low so as to turn on the MOSFET 37 and turn off the MOSFET 36, the active WP signal S102 is supplied to the NOR circuit 32 via the MOSFET 37, so that the output S111 of the NOR circuit 32 goes low. However, the output S112 of the NOR circuit 34 remains low since the MOSFET 36 is turned off and the output S112 (low level) is supplied to the NOR circuit 34 via the inverter 33 (i.e., the high level signal). Thus, the WP signal S102 remains high.

In the same manner as described above, every time the WP release command is identified by the WP release command identifying portion 9b, the WP signal S102 goes high and low alternately. According to this embodiment, the WP signal can be activated and inactivated by toggling operation for one single command so that the command system can be simplified.

In the embodiments described above, specific values of the input data and address, such as 47H, 57H, d0H and FFH are used in order to identify the commands. However, data and address values are not limited to these specific values. In addition, the WP signal can be set active when it goes low. Other signals can also be set active when they go low.

It will be appreciated that the present invention can be applied to nonvolatile semiconductor memory devices other than flash memories having floating gates which are described above. For example, the present invention can be applied to nonvolatile semiconductor memory devices having memory cells including gate insulating layers made of ferroelectric material, or nonvolatile semiconductor memory devices having memory cells utilizing DRAM capacitors including ferroelectric insulating layers. Such nonvolatile semiconductor memory devices store the data utilizing polarization inversion of the ferroelectric material so that very thin tunnel oxide layers are not required. This makes it possible to further integrate the nonvolatile semiconductor memories.

As described above, according to the present invention, the WP signal for activating a write protect state which is set for each erase block is internally generated in the WP signal generator provided in the command state machine. The WP signal is controlled using at least one command which is externally input. Thus, an additional IC pin for externally inputting the WP signal is not required, so that pin-to-pin compatibility to conventional EPROMs and EEPROMs can be realized. This makes it possible to simplify the peripheral circuits. Furthermore, by automatically activating the WP signal when the system is turned on or reset, an accidental erase/rewrite of the data is well prevented.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An electrically erasable and rewritable semiconductor memory device including at least one memory block, comprising:

a WP signal generator for generating a WP signal for controlling protection of data stored in the memory block;

a protect state setting section for setting a protect state for the memory block, the data stored in the memory block being protectable from erase/write operations when the protect state is set to the memory block; and a data protecting section for prohibiting the erase/write operations for the memory block to which the protect state is set, in the case where the WP signal is active;

wherein the WP signal generator includes:

a WP set command identifying section for receiving a WP set command represented by at least one predetermined value selected from values of data and values of at least one address which are input in at least one bus cycle, and for identifying the WP set command by detecting the at least one predetermined value; and a generating section for activating the WP signal when the WP set command is identified during the WP signal is inactive.

2. An electrically erasable and rewritable semiconductor memory device according to claim 1, wherein the WP set command identifying section identifies the WP set command by detecting a predetermined combination including a specific value of data input in a first bus cycle and a specific value of data input in a second bus cycle.

3. An electrically erasable and rewritable semiconductor memory device according to claim 2, wherein the predetermined combination further includes at least one of a specific value of an address in the first bus cycle and a specific value of an address in the second bus cycle.

4. An electrically erasable and rewritable semiconductor memory device according to claim 1, wherein the WP set command identifying section includes:

a data comparing circuit for detecting if input data matches a predetermined data value for each bus cycle, whereby outputting a data comparison result;

a result latch circuit for latching the data comparison result;

an address comparing circuit for detecting if an input address matches a predetermined address value for each bus cycle, whereby outputting an address comparison result; and a logical circuit for identifying the WP set command when the data comparison result of a first bus cycle which is latched in the result latch circuit, the data comparison result of a second bus cycle, and the address comparison result of the second bus cycle are affirmative.

5. An electrically erasable and rewritable semiconductor memory device according to claim 4, wherein the WP set command identifying section further includes:

a data latch circuit for latching data in each bus cycle; and an address latch circuit for latching an address in each bus cycle.

6. An electrically erasable and rewritable semiconductor memory device according to claim 1, wherein the generating section activates the WP signal when a system including the semiconductor memory device is turned on and when the system is reset.

7. An electrically erasable and rewritable semiconductor memory device according to claim 1 including a plurality of memory blocks, further comprising a protect state set command identifying section for receiving a protect state set command and a protect address, the protect state set command being represented by at least one predetermined value selected from values of data and values of at least one address which are input in at least one bus cycle, the protect address representing a memory block to which the protect state is set and being input in the at least one bus cycle, and for identifying the protect state set command by detecting the at least one predetermined value, wherein the protect state setting section sets the protect state for the memory block indicated by the protect address when the protect state set command is identified by the protect state set command identifying section, and wherein the generating section of the WP signal generator activates the WP signal when the protect state set command is identified by the protect state set command identifying section.

8. An electrically erasable and rewritable semiconductor memory device including at least one memory block, comprising:

a WP signal generator for generating a WP signal for controlling protection of data stored in the memory block;

a protect state setting section for setting a protect state for the memory block, the data stored in the memory block being protectable from erase/write operations when the protect state is set to the memory block; and a data protecting section for prohibiting the erase/write operations for the memory block to which the protect state is set, in the case where the WP signal is active;

wherein the WP signal generator includes:

a WP release command identifying section for receiving a WP release command represented by at least one predetermined value selected from values of data and values of at least one address which are input in at least one bus cycle, and for identifying the WP release command by detecting the at least one predetermined value; and a generating section for inactivating the WP signal when the WP release command is identified during the WP signal is active.

9. An electrically erasable and rewritable semiconductor memory device according to claim 8,
wherein the WP signal generator further includes a WP set command identifying section for receiving a WP set command represented by at least one predetermined value selected from values of data and values of at least one address which are input in at least one bus cycle, and for identifying the WP set command by detecting the predetermined combination, and
wherein the generating section activates the WP signal when the WP set command is identified during the WP signal is inactive.

10. An electrically erasable and rewritable semiconductor memory device according to claim 8, wherein the WP release command identifying section identifies the WP release command by detecting a predetermined combination including a specific value of data input in a first bus cycle and a specific value of data input in a second bus cycle.

11. An electrically erasable and rewritable semiconductor memory device according to claim 10, wherein the predetermined combination further includes at least one of a specific value of an address in the first bus cycle and a specific value of an address in the second bus cycle.

12. An electrically erasable and rewritable semiconductor memory device according to claim 8, wherein the WP release command identifying section includes:
a data comparing circuit for detecting if input data matches a predetermined data value for each bus cycle, whereby outputting a data comparison result;
a result latch circuit for latching the data comparison result;
an address comparing circuit for detecting if an input address matches a predetermined address value for each bus cycle, whereby outputting an address comparison result; and
a logical circuit for identifying the WP release command when the data comparison result of a first bus cycle which is latched in the result latch circuit, the data comparison result of a second bus cycle, and the address comparison result of the second bus cycle are affirmative.

13. An electrically erasable and rewritable semiconductor memory device according to claim 12, wherein the WP release command identifying section further includes:
a data latch circuit for latching data in each bus cycle; and
an address latch circuit for latching an address in each bus cycle.

14. An electrically erasable and rewritable semiconductor memory device according to claim 8, wherein the generating section activates the WP signal when a system including the semiconductor memory device is turned on and when the system is reset.

15. An electrically erasable and rewritable semiconductor memory device according to claim 9, wherein the generating section activates the WP signal when a system including the semiconductor memory device is turned on and when the system is reset.

16. An electrically erasable and rewritable semiconductor memory device according to claim 8 including a plurality of memory blocks, further comprising a protect state set command identifying section for receiving a protect state set command and a protect address, the protect state set command being represented by at least one predetermined value selected from values of data and values of at least one address which are input in at least one bus cycle, the protect address representing a memory block to which the protect state is set and being input in the at least one bus cycle, and for identifying the protect state set command by detecting the at least one predetermined value,
wherein the protect state setting section sets the protect state for the memory block indicated by the protect address when the protect state set command is identified by the protect state set command identifying section, and
wherein the generating section of the WP signal generator activates the WP signal when the protect state set command is identified by the protect state set command identifying section.

17. A method for protecting data stored in an electrically erasable and rewritable semiconductor memory device including at least one memory block, the method includes the steps of:
generating a WP signal for controlling protection of the data stored in the memory block;
setting a protect state for the memory block, the data stored in the memory block being protectable from erase/write operations when the protect state is set to the memory block;
prohibiting the erase/write operations for the memory block to which the protect state is set in the case where the WP signal is active; and
identifying a WP set command,
wherein the WP set command identifying step includes the steps of:
inputting a WP set command represented by at least one predetermined value selected from values of data and values of at least one address using at least one bus cycle;
identifying the WP set command by detecting the at least one predetermined value; and
activating the WP signal when the WP set command is identified during the WP signal is inactive.

18. A method for protecting data stored in an electrically erasable and rewritable semiconductor memory device according to claim 17, wherein the WP set command identifying step includes detecting a predetermined combination including a specific value of data input in a first bus cycle and a specific value of data input in a second bus cycle.

19. A method for protecting data stored in an electrically erasable and rewritable semiconductor memory device according to claim 18, wherein the WP set command identifying step further includes detecting at least one of a specific value of an address in the first bus cycle and a specific value of an address in the second bus cycle.

20. A method for protecting data stored in an electrically erasable and rewritable semiconductor memory device according to claim 17, wherein the WP set command identifying step includes the step of:
detecting if input data matches a predetermined data value for each bus cycle, whereby generating a data comparison result;
latching the data comparison result;
detecting if an input address matches a predetermined address value for each bus cycle, whereby generating an address comparison result; and
identifying the WP set command when the data comparison result of a first bus cycle which is latched in the latching step, the data comparison result of a second bus cycle, and the address comparison result of the second bus cycle are affirmative.

21. A method for protecting data stored in an electrically erasable and rewritable semiconductor memory device according to claim 20, wherein the WP set command identifying step includes the steps of:

latching data in each bus cycle; and latching an address in each bus cycle.

22. A method for protecting data stored in an electrically erasable and rewritable semiconductor memory device according to claim 17, wherein the WP signal generating step includes activating the WP signal when a system including the semiconductor memory device is turned on and when the system is reset.

23. A method for protecting data stored in an electrically erasable and rewritable semiconductor memory device according to claim 17, the semiconductor memory device including a plurality of memory blocks, the method further comprising the steps of:

inputting a protect state set command and a protect address, the protect state set command being represented by at least one predetermined value selected from values of data and values of at least one address which are input in at least one bus cycle, the protect address representing a memory block to which the protect state is set and being input in the at least one bus cycle;

identifying the protect state set command by detecting the at least one predetermined value;

setting the protect state for the memory block indicated by the protect address when the protect state set command is identified; and activating the WP signal when the protect state set command is identified.

24. A method for protecting data stored in an electrically erasable and rewritable semiconductor memory device including at least one memory block, the method including the steps of:

generating a WP signal for controlling protection of the data stored in the memory block;

setting a protect state for the memory block, the data stored in the memory block being protectable from erase/write operations when the protect state is set to the memory block;

prohibiting the erase/write operations for the memory block to which the protect state is set in the case where the WP signal is active; and identifying a WP release command, wherein the WP release command identifying step includes the steps of:

inputting a WP release command represented by at least one predetermined value selected from values of data and values of at least one address using at least one bus cycle;

identifying the WP release command by detecting the at least one predetermined value; and inactivating the WP signal when the WP set command is identified during the WP signal is active.

25. A method for protecting data stored in an electrically erasable and rewritable semiconductor memory device according to claim 24, further including the steps of:

inputting a WP set command represented by at least one predetermined value selected from values of data and values of at least one address which are input in at least one bus cycle;

identifying the WP set command by detecting the predetermined combination; and activating the WP signal when the WP set command is identified during the WP signal is inactive.

26. A method for protecting data stored in an electrically erasable and rewritable semiconductor memory device according to claim 24, wherein the WP release command identifying step includes detecting a predetermined combination including a specific value of data input in a first bus cycle and a specific value of data input in a second bus cycle.

27. A method for protecting data stored in an electrically erasable and rewritable semiconductor memory device according to claim 26, wherein the WP release command identifying step further includes detecting at least one of a specific value of an address in the first bus cycle and a specific value of an address in the second bus cycle.

28. A method for protecting data stored in an electrically erasable and rewritable semiconductor memory device according to claim 24, wherein the WP release command identifying step includes the steps of:

detecting if input data matches a predetermined data value for each bus cycle, whereby generating a data comparison result;

latching the data comparison result;

detecting if an input address matches a predetermined address value for each bus cycle, whereby generating an address comparison result; and identifying the WP release command when the data comparison result of a first bus cycle which is latched in the latching step, the data comparison result of a second bus cycle, and the address comparison result of the second bus cycle are affirmative.

29. A method for protecting data stored in an electrically erasable and rewritable semiconductor memory device according to claim 28, wherein the WP release command identifying section further includes the steps of:

latching data in each bus cycle; and latching an address in each bus cycle.

30. A method for protecting data stored in an electrically erasable and rewritable semiconductor memory device according to claim 24, wherein the WP signal generating step includes activating the WP signal when a system including the semiconductor memory device is turned on and when the system is reset.

31. A method for protecting data stored in an electrically erasable and rewritable semiconductor memory device according to claim 25, wherein the WP signal generating step includes activating the WP signal when a system including the semiconductor memory device is turned on and when the system is reset.

32. A method for protecting data stored in an electrically erasable and rewritable semiconductor memory device according to claim 24, the semiconductor memory device including a plurality of memory blocks, the method further comprising the steps of:

inputting a protect state set command and a protect address, the protect state set command being represented by at least one predetermined value selected from values of data and values of at least one address which are input in at least one bus cycle, the protect address representing a memory block to which the protect state is set and being input in the at least one bus cycle;

identifying the protect state set command by detecting the at least one predetermined value;

setting the protect state for the memory block indicated by the protect address when the protect state set command is identified; and activating the WP signal when the protect state set command is identified.

\* \* \* \* \*